(12) United States Patent
Shiraki et al.

(10) Patent No.: US 7,821,069 B2
(45) Date of Patent: Oct. 26, 2010

(54) SEMICONDUCTOR DEVICE AND METHOD FOR MANUFACTURING THE SAME

(75) Inventors: Satoshi Shiraki, Toyohashi (JP); Hiroyuki Ban, Hazu-gun (JP); Akira Yamada, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 458 days.

(21) Appl. No.: 12/010,111

(22) Filed: Jan. 22, 2008

(65) Prior Publication Data

US 2009/0127605 A1    May 21, 2009

(30) Foreign Application Priority Data

Jan. 25, 2007 (JP) ............................ 2007-015183
Mar. 20, 2007 (JP) ............................ 2007-073316

(51) Int. Cl.
*H01L 23/62* (2006.01)

(52) U.S. Cl. .................. 257/350; 257/154; 257/296; 257/335; 257/341; 257/351; 257/358; 257/516; 438/17

(58) Field of Classification Search .............. 257/154, 257/296, 335, 341, 350, 351, 358, 516; 438/17
See application file for complete search history.

(56) References Cited

U.S. PATENT DOCUMENTS

| 4,394,590 | A | 7/1983 | Honda |
| 4,751,408 | A | 6/1988 | Rambert |
| 6,392,950 | B2 | 5/2002 | Ayukawa et al. |
| 6,411,561 | B2 | 6/2002 | Ayukawa et al. |
| 6,587,393 | B2 | 7/2003 | Ayukawa et al. |
| 6,847,575 | B2 | 1/2005 | Ayukawa et al. |
| 2005/0128853 | A1 | 6/2005 | Ayukawa et al. |
| 2006/0231868 | A1 | 10/2006 | Yamada et al. |

FOREIGN PATENT DOCUMENTS

| DE | 10313264 A1 | 10/2004 |
| JP | A-08-079035 | 3/1996 |
| JP | A-2003-332520 | 11/2003 |

OTHER PUBLICATIONS

The Nikkan Kogyo Shimbun, Ltd., *Application Technique of Power MOSFET*, pp. 129-131 (with English translation).
Office Action issued from German Patent Office dated Mar. 27, 2009 in the corresponding German Patent Application No. 102008006124.7 (and English Translation).
The Nikkan Kogyo Shimbun, Ltd., *Application Technique of Power MOSFET*, Published Oct. 24, 1988, pp. 128-131 (with English Translation).

*Primary Examiner*—Tan N Tran
(74) *Attorney, Agent, or Firm*—Posz Law Group, PLC

(57) ABSTRACT

A semiconductor device includes: n transistor elements; n resistive elements; and n capacitive elements, each kind of elements coupled in series between the first and second terminals. The gate of each transistor element has a gate pad, and each transistor element includes transistor pads disposed on both sides. Each resistive element includes resistive pads disposed on both sides. Each capacitive element includes capacitive pads disposed on both sides. The gate pad other than the first stage transistor element, a corresponding resistive pad, and a corresponding capacitive pad are electrically coupled. One transistor pad, one resistive pad, and one capacitive pad in the first stage are electrically coupled. One transistor pad, one resistive pad, and one capacitive pad in the n-th stage are electrically coupled.

24 Claims, 13 Drawing Sheets

US 7,821,069 B2

SEMICONDUCTOR DEVICE AND METHOD FOR MANUFACTURING THE SAME

CROSS REFERENCE TO RELATED APPLICATIONS

This application is based on Japanese Patent Applications No. 2007-15183 filed on Jan. 25, 2007, and No. 2007-73316 filed on Mar. 20, 2007, the disclosures of which are incorporated herein by reference.

FIELD OF THE INVENTION

The present invention relates to a semiconductor device and a method for manufacturing a semiconductor device.

BACKGROUND OF THE INVENTION

Conventionally, as a high withstand voltage semiconductor device, there has been the semiconductor device described in JP-A-2006-148058 corresponding to U.S. Pat. No. 7,239,181. FIG. 10 is a diagram of an equivalent circuit of the semiconductor device 1000 in JP-A-2006-148058.

As shown in FIG. 10, in the semiconductor device 1000, n ($n \geq 2$) transistor elements Tr1 to Trn that are insulated and separated from each other are sequentially series-connected between a ground (GND) potential and a predetermined potential Vs, with the transistor element near the GND potential being a first stage and the transistor element near the predetermined potential Vs being an n-th stage. Further, the gate terminal of the first stage transistor element Trn serves as an input terminal of the semiconductor device 1000, and n resistive elements R1 to Rn are sequentially series-connected between the GND potential and the predetermined potential Vs, with the resistive element near the GND potential being a first stage and the resistive element near the predetermined potential Vs being an n-th stage. Additionally, the gate terminals of the transistor elements Tr2 to Trn of each stage excluding the first stage transistor element Tr1 are sequentially connected to connection points between the series-connected resistive elements R1 to Rn of each stage, and an output is removed via a load resistor (not shown) having a predetermined resistance value from the terminal of the transistor element Trn of the n-th stage near the predetermined potential Vs.

The n transistor elements Tr1 to Trn in this semiconductor device 1000 are formed on an n-conductive type semiconductor layer of an SOI structure semiconductor substrate including an embedded oxide film. Further, the n transistor elements Tr1 to Trn comprise N channel LDMOS or the like, for example, and are insulated and separated from each other by element separating trenches reaching the embedded oxide film.

Additionally, multiple field separating trenches reaching the embedded oxide film are formed, and the n transistor elements Tr1 to Trn that are insulated and separated from each other are sequentially disposed one at a time so as to include the high stage transistor element in each field region surrounded by the field separating trenches.

Thus, the voltage applied to each field region surrounded by the field separating trenches can be equalized in accordance with a voltage increase from the GND potential to the predetermined potential Vs, and the voltage range handled by the n transistor elements Tr1 to Trn can be moved in order from the GND potential to the predetermined potential Vs. Consequently, even with transistor elements having a normal withstand voltage that can be fabricated inexpensively using a common fabricating method, there can be configured a semiconductor device that ensures a high withstand voltage required overall by appropriately setting the number n of the transistor elements.

However, in the semiconductor device 1000 described in JP-A-2006-148058, the elements (transistor elements, resistive elements, etc.) are electrically interconnected by aluminum wiring. Consequently, there has been the problem that when testing of the semiconductor device 1000 is to be implemented, defects when testing is performed by a combination of the elements can be detected, but testing of element units (e.g., minute resistance value shifts, etc.) cannot be performed. Consequently, there is the potential for durability deterioration of element units and characteristic fluctuations to occur.

Thus, it is required for a semiconductor device with high reliability.

Further, in a power device that drives a three-phase motor, for example, the main power supply has a high voltage of 100 V to 400 V, for example. For this reason, a high-voltage IC (HVIC) disposed with a photocoupler and an LDMOS transistor is used for the drive circuit that drives the power device.

In high-voltage ICs that handle a high voltage of 600 V or greater, for example, a withstand voltage of 600 V or greater becomes necessary, but because it is difficult to ensure a withstand voltage of 600 V or greater with a stand-alone LDMOS transistor, a tandem structure is known which ensures a withstand voltage by connecting LDMOS transistors having a withstand voltage of 600 V or less.

However, in this tandem structure, the voltage dividing resistance value that voltage-divides the LDMOS transistors is several M$\Omega$, which is high. For this reason, there has been the problem that the current ends up flowing to the parasitic capacitance on the substrate side when there is a surge in the high-voltage IC, the voltage applied to one of the LDMOS transistors becomes larger, and the withstand current rating resultantly becomes smaller.

Thus, a structure has been proposed in JP-A-2006-148058, for example, which disperses the voltage of each stage of the tandem structure to prevent surge breakdown by disposing smoothing capacitors in parallel with voltage dividing resistors and allowing a surge current to flow.

In a high-voltage IC having the above-described structure, it is conceivable, when testing the leak current of the smoothing capacitor and the resistance value of the voltage dividing resistor of each stage in the tandem structure, to dispose test pads on both ends of these smoothing capacitors and voltage dividing resistors and allow a current to flow to each pad to detect the leak current of the smoothing capacitors.

However, because the smoothing capacitors is connected in parallel with the voltage dividing resistors, the current flowing to each of the test pads ends up flowing to the voltage dividing resistors. For this reason, even when an extremely weak leak current occurs in the smoothing capacitor, that abnormality has not been able to be detected.

Thus, it is required for a semiconductor device to test the leak current of a smoothing capacitor and the resistance value of a voltage dividing resistor correctly.

SUMMARY OF THE INVENTION

In view of the above-described problem, it is an object of the present disclosure to provide a semiconductor device. It is another object of the present disclosure to provide a method for manufacturing a semiconductor device.

According to a first aspect of the present disclosure, a semiconductor device includes: a first terminal and a second terminal, wherein the first terminal has a predetermined first potential smaller than a predetermined second potential of the second terminal; n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element; n resistive elements that are sequentially coupled in series between the first terminal and the second terminal, wherein one resistive element nearest the first terminal is defined as a first stage resistive element, and another transistor element nearest the second terminal is defined as a n-th stage resistive element; and n capacitive elements that are sequentially coupled in series between the first terminal and the second terminal, wherein one capacitive element nearest the first terminal is defined as a first stage capacitive element, and another transistor element nearest the second terminal is defined as a n-th stage capacitive element. Each transistor element includes a source, gate and a drain. The gate of each transistor element has a gate pad. The transistor element includes a pair of transistor pads, which are disposed on both sides of the transistor element. The gate pad of the first stage transistor element provides an input terminal. One of the transistor pads of the n-th stage transistor element disposed on the second terminal side provides an output terminal. Each resistive element includes a pair of resistive pads, which are disposed on both sides of the resistive element. Each capacitive element includes a pair of capacitive pads, which are disposed on both sides of the capacitive element. The gate pad of each transistor element other than the first stage transistor element, a corresponding one of the resistive pads between two adjacent resistive elements, and a corresponding one of the capacitive pads between two adjacent capacitive elements are electrically coupled together through a first conductive connection member. One of the transistor pads of the first stage transistor element disposed on the first terminal side, one of the resistive pads of the first stage resistive element disposed on the first terminal side, and one of the capacitive pads of the first stage capacitive element disposed on the first terminal side are electrically coupled with a second conductive connection member. One of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side are electrically coupled with a third conductive connection member.

In the above device, by using the pads, each transistor element, each resistive element and each capacitive element are individually tested. After that, the transistor element, the resistive element and the capacitive element are electrically connected together. Accordingly, since each element is individually tested, durability and deviation of characteristics in each element can be improved. Thus, the device has high reliability.

Alternatively, the first to third conductive connection members may be made of an electric lead. Alternatively, each transistor element may be disposed in a corresponding field region so that n field regions are electrically isolated together, and each field region may have an electric potential, which is stabilized with the gate of a corresponding transistor element. Alternatively, the gate and transistor pads in each transistor element may be disposed on a corresponding transistor element, the pair of resistive pads in each resistive element may be disposed on a corresponding resistive element, or the pair of capacitive pads in each capacitive element may be disposed on a corresponding capacitive element. Alternatively, each of the gate and transistor pads in each transistor element may include a first thin film resistor, which is disposed between the transistor element and the pad, each of resistive pads in each resistive element may include a second thin film resistor, which is disposed between the resistive element and the pad, and each of capacitive pads in each capacitive element may include a third thin film resistor, which is disposed between the capacitive element and the pad.

According to a second aspect of the present disclosure, a semiconductor device includes: a first terminal and a second terminal, wherein the first terminal has a predetermined first potential smaller than a predetermined second potential of the second terminal; n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element; n resistive elements that are sequentially coupled in series between the first terminal and the second terminal, wherein one resistive element nearest the first terminal is defined as a first stage resistive element, and another transistor element nearest the second terminal is defined as a n-th stage resistive element; and n capacitive elements that are sequentially coupled in series between the first terminal and the second terminal, wherein one capacitive element nearest the first terminal is defined as a first stage capacitive element, and another transistor element nearest the second terminal is defined as a n-th stage capacitive element. Each transistor element includes a source, gate and a drain. The gate of each transistor element has a gate pad. Each transistor element includes a pair of transistor pads, which are disposed on both sides of the transistor element. The gate pad of the first stage transistor element provides an input terminal. One of the transistor pads of the n-th stage transistor element disposed on the second terminal side provides an output terminal. Each resistive element includes a pair of resistive pads, which are disposed on both sides of the resistive element. Each capacitive element includes a pair of capacitive pads, which are disposed on both sides of the capacitive element. The gate pad of each transistor element other than the first stage transistor element, a corresponding one of the resistive pads between two adjacent resistive elements, and a corresponding one of the capacitive pads between two adjacent capacitive elements are electrically coupled together through a first switching element. One of the transistor pads of the first stage transistor element disposed on the first terminal side, one of the resistive pads of the first stage resistive element disposed on the first terminal side, and one of the capacitive pads of the first stage capacitive element disposed on the first terminal side are electrically coupled with a second switching element. One of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side are electrically coupled with a third switching element.

In the above device, by using the pads, each transistor element, each resistive element and each capacitive element are individually tested. After that, the transistor element, the resistive element and the capacitive element are electrically connected together. Accordingly, since each element is individually tested, durability and deviation of characteristics in each element can be improved. Thus, the device has high reliability.

According to a third aspect of the present disclosure, a semiconductor device includes: a first terminal and a second terminal, wherein the first terminal has a predetermined first potential smaller than a predetermined second potential of the second terminal; n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element; n resistive elements that are sequentially coupled in series between the first terminal and the second terminal, wherein one resistive element nearest the first terminal is defined as a first stage resistive element, and another transistor element nearest the second terminal is defined as a n-th stage resistive element; and n capacitive elements that are sequentially coupled in series between the first terminal and the second terminal, wherein one capacitive element nearest the first terminal is defined as a first stage capacitive element, and another transistor element nearest the second terminal is defined as a n-th stage capacitive element. Each transistor element includes a source, gate and a drain. The gate of each transistor element has a gate pad. Each transistor element includes a pair of transistor pads, which are disposed on both sides of the transistor element. The gate pad of the first stage transistor element provides an input terminal. One of the transistor pads of the n-th stage transistor element disposed on the second terminal side provides an output terminal. Each resistive element includes a pair of resistive pads, which are disposed on both sides of the resistive element. Each capacitive element includes a pair of capacitive pads, which are disposed on both sides of the capacitive element. The gate pad of each transistor element other than the first stage transistor element is connected to a first wiring layer, a corresponding one of the resistive pads between two adjacent resistive elements is connected to a second wiring layer, and a corresponding one of the capacitive pads between two adjacent capacitive elements is connected to a third wiring layer. The first to third wiring layers are stacked in this order through a first insulation film, and material of the first to third wiring layers is diffused into the first insulation film so that the first to third wiring layers are electrically coupled together. One of the transistor pads of the first stage transistor element disposed on the first terminal side is connected to a fourth wiring layer, one of the resistive pads of the first stage resistive element disposed on the first terminal side is connected to a fifth wiring layer, and one of the capacitive pads of the first stage capacitive element disposed on the first terminal side is connected to a sixth wiring layer. The fourth to sixth wiring layers are stacked in this order through a second insulation film, and material of the fourth to sixth wiring layers is diffused into the second insulation film so that the fourth to sixth wiring layers are electrically coupled together. One of the transistor pads of the n-th stage transistor element disposed on the second terminal side is connected to a seventh wiring layer, one of the resistive pads of the n-th stage resistive element disposed on the second terminal side is connected to an eight wiring layer, and one of the capacitive pads of the n-th stage capacitive element disposed on the second terminal side is connected to a ninth wiring layer. The seventh to ninth wiring layers are stacked in this order through a third insulation film, and material of the seventh to ninth wiring layers is diffused into the third insulation film so that the seventh to ninth wiring layers are electrically coupled together.

In the above device, by using the pads, each transistor element, each resistive element and each capacitive element are individually tested. After that, the transistor element, the resistive element and the capacitive element are electrically connected together. Accordingly, since each element is individually tested, durability and deviation of characteristics in each element can be improved. Thus, the device has high reliability.

According to a fourth aspect of the present disclosure, a semiconductor device includes: a first terminal and a second terminal, wherein the first terminal has a predetermined first potential smaller than a predetermined second potential of the second terminal; n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element; n resistive elements that are sequentially coupled in series between the first terminal and the second terminal, wherein one resistive element nearest the first terminal is defined as a first stage resistive element, and another transistor element nearest the second terminal is defined as a n-th stage resistive element; and n capacitive elements that are sequentially coupled in series between the first terminal and the second terminal, wherein one capacitive element nearest the first terminal is defined as a first stage capacitive element, and another transistor element nearest the second terminal is defined as a n-th stage capacitive element. Each transistor element includes a source, gate and a drain. The gate of each transistor element has a gate pad. Each transistor element includes a pair of transistor pads, which are disposed on both sides of the transistor element. The gate pad of the first stage transistor element provides an input terminal. One of the transistor pads of the n-th stage transistor element disposed on the second terminal side provides an output terminal. Each resistive element includes a pair of resistive pads, which are disposed on both sides of the resistive element. Each capacitive element includes a pair of capacitive pads, which are disposed on both sides of the capacitive element. The gate pad of each transistor element other than the first stage transistor element, a corresponding one of the resistive pads between two adjacent resistive elements, and a corresponding one of the capacitive pads between two adjacent capacitive elements are electrically connectable. One of the transistor pads of the first stage transistor element disposed on the first terminal side, one of the resistive pads of the first stage resistive element disposed on the first terminal side, and one of the capacitive pads of the first stage capacitive element disposed on the first terminal side are electrically connectable. One of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side are electrically connectable.

In the above device, by using the pads, each transistor element, each resistive element and each capacitive element are individually tested. Accordingly, since each element is individually tested, durability and deviation of characteristics in each element can be improved. Thus, the device has high reliability.

According to a fifth aspect of the present disclosure, a method for manufacturing a semiconductor device includes: sequentially coupling n transistor elements in series with each other between a first terminal and a second terminal, wherein the first terminal has a predetermined first potential smaller than a predetermined second potential of the second terminal, wherein n represents a predetermined natural number equal to or greater than two, wherein the n transistor elements are insulated and separated from each other, wherein one transistor element nearest the first terminal is defined as a first stage transistor element, and another transistor element nearest the second terminal is defined as a n-th stage transistor element, wherein each transistor element includes a source, gate and a drain, wherein the gate of each transistor element has a gate pad, wherein each transistor element includes a pair of transistor pads, which are disposed on both sides of the transistor element, wherein the gate pad of the first stage transistor element provides an input terminal, and wherein one of the transistor pads of the n-th stage transistor element disposed on the second terminal side provides an output terminal; sequentially coupling n resistive elements in series between the first terminal and the second terminal, wherein one resistive element nearest the first terminal is defined as a first stage resistive element, and another transistor element nearest the second terminal is defined as a n-th stage resistive element, and wherein each resistive element includes a pair of resistive pads, which are disposed on both sides of the resistive element; sequentially coupling n capacitive elements in series between the first terminal and the second terminal, wherein one capacitive element nearest the first terminal is defined as a first stage capacitive element, and another transistor element nearest the second terminal is defined as a n-th stage capacitive element, and wherein each capacitive element includes a pair of capacitive pads, which are disposed on both sides of the capacitive element; testing each transistor element with using corresponding gate and transistor pads; testing each resistive element with using corresponding resistive pads; testing each capacitive element with using corresponding capacitive pads; electrically coupling the gate pad of each transistor element other than the first stage transistor element, a corresponding one of the resistive pads between two adjacent resistive elements, and a corresponding one of the capacitive pads between two adjacent capacitive elements; electrically coupling one of the transistor pads of the first stage transistor element disposed on the first terminal side, one of the resistive pads of the first stage resistive element disposed on the first terminal side, and one of the capacitive pads of the first stage capacitive element disposed on the first terminal side; and electrically coupling one of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side.

In the above device, by using the pads, each transistor element, each resistive element and each capacitive element are individually tested. After that, the transistor element, the resistive element and the capacitive element are electrically connected together. Accordingly, since each element is individually tested, durability and deviation of characteristics in each element can be improved. Thus, the device has high reliability.

Alternatively, the method may further includes: arranging each transistor element in a corresponding field region so that n field regions are electrically isolated together; and stabilizing an electric potential of each field region with the gate of a corresponding transistor element. The testing each transistor element further includes detecting a leakage current between two field regions. Alternatively, the gate pad of each transistor element other than the first stage transistor element, the corresponding one of the resistive pads between two adjacent resistive elements, and the corresponding one of the capacitive pads between two adjacent capacitive elements may be electrically coupled together through a first conductive connection member. The one of the transistor pads of the first stage transistor element disposed on the first terminal side, the one of the resistive pads of the first stage resistive element disposed on the first terminal side, and the one of the capacitive pads of the first stage capacitive element disposed on the first terminal side may be electrically coupled with a second conductive connection member. The one of the transistor pads of the n-th stage transistor element disposed on the second terminal side, the one of the resistive pads of the n-th stage resistive element disposed on the second terminal side, and the one of the capacitive pads of the n-th stage capacitive element disposed on the second terminal side may be electrically coupled with a third conductive connection member. Alternatively, the gate pad of each transistor element other than the first stage transistor element, the corresponding one of the resistive pads between two adjacent resistive elements, and the corresponding one of the capacitive pads between two adjacent capacitive elements may be electrically coupled together through a first switching element. The one of the transistor pads of the first stage transistor element disposed on the first terminal side, the one of the resistive pads of the first stage resistive element disposed on the first terminal side, and the one of the capacitive pads of the first stage capacitive element disposed on the first terminal side may be electrically coupled with a second switching element. The one of the transistor pads of the n-th stage transistor element disposed on the second terminal side, the one of the resistive pads of the n-th stage resistive element disposed on the second terminal side, and the one of the capacitive pads of the n-th stage capacitive element disposed on the second terminal side may be electrically coupled with a third switching element. In all of the testing each transistor element, the testing each resistive element and the testing each capacitive element, the first to third switching elements may turn off, and in all of the electrically coupling the gate pad of each transistor element other than the first stage transistor element, the electrically coupling the one of the transistor pads of the first stage transistor element disposed on the first terminal side, and the electrically coupling one of the transistor pads of the n-th stage transistor element disposed on the second terminal side, the first to third switching elements may turn on. Alternatively, the method may further includes: connecting the gate pad of each transistor element other than the first stage transistor element to a first wiring layer, connecting a corresponding one of the resistive pads between two adjacent resistive elements to a second wiring layer, and connecting a corresponding one of the capacitive pads between two adjacent capacitive elements to a third wiring layer; stacking the first to third wiring layers in this order through a first insulation film; connecting one of the transistor pads of the first stage transistor element disposed on the first terminal side to a fourth wiring layer, connecting one of the resistive pads of the first stage resistive element disposed on the first terminal side to a fifth wiring layer, and connecting one of the capacitive pads of the first stage capacitive element disposed on the first terminal side to a sixth wiring layer; stacking the fourth to sixth wiring layers in this order through a second insulation film; connecting one of the transistor pads of the n-th stage transistor element disposed on the second terminal side to a seventh wiring layer, connecting one of the resistive pads of the n-th stage resistive element disposed on the second terminal side to an eight wiring layer, and connecting one of the capacitive pads of the n-th stage capacitive element disposed on the second terminal side to a ninth wiring layer; and stacking the seventh to ninth wiring layers in this order through a third insulation film. The electrically coupling the gate pad of each transistor element other than the first stage transistor element includes diffusing material of the first to third wiring layers into the first insulation film so that the first to third wiring layers are electrically coupled together. The electrically coupling one of the transistor pads of the first stage transistor element disposed on the first terminal side includes diffusing material of the fourth to sixth wiring layers into the second insulation film so that the fourth to sixth wiring layers are electrically coupled together. The electrically coupling one of the transistor pads of the n-th stage transistor element disposed on the second terminal side includes diffusing material of the seventh to ninth wiring layers into the third insulation film so that the seventh to ninth wiring layers are electrically coupled together.

According to a sixth aspect of the present disclosure, a semiconductor device includes: a plurality of transistors that are insulated and separated from each other and are coupled in series between a ground potential and a constant voltage terminal; a plurality of pairs of a voltage dividing resistor and a diode, wherein the voltage dividing resistor and the diode in each pair are coupled in series between two gates of corresponding adjacent transistors; a plurality of capacitors, each of which is coupled in parallel with a corresponding pair of the voltage dividing resistor and the diode between two gates of corresponding adjacent transistors; and a plurality of test pads, each of which is coupled with a gate of a corresponding transistor. Each diode is coupled in series with a corresponding voltage dividing resistor so that current flows through the voltage dividing resistor when a corresponding transistor turns on. A current path is provided between two adjacent test pads through a corresponding pair of the voltage dividing resistor and the diode when a predetermined voltage is applied between the two adjacent test pads so as to apply a forward bias to the diode. A current path is provided between two adjacent test pads through a corresponding capacitor when a predetermined voltage is applied between the two adjacent test pads so as to apply a reverse bias to the diode.

In the above device, when the resistance of the voltage dividing resistor is detected, the current does not flow through the capacitor. Further, when the current leakage of the capacitor is detected, the current does not flow through the voltage dividing resistor. Thus, the device can detect the resistance of the voltage dividing resistor and the current leakage of the capacitor with high accuracy.

According to a seventh aspect of the present disclosure, a method for manufacturing a semiconductor device includes: coupling a plurality of transistors in series between a ground potential and a constant voltage terminal, wherein the transistors are insulated and separated from each other; coupling a pair of a voltage dividing resistor and a diode in series between two gates of corresponding adjacent transistors, wherein each diode is coupled in series with a corresponding voltage dividing resistor so that current flows through the voltage dividing resistor when a corresponding transistor turns on; coupling a capacitor in parallel with a corresponding pair of the voltage dividing resistor and the diode between two gates of corresponding adjacent transistors; coupling a test pad with a gate of a corresponding transistor; detecting a resistance of one of the voltage dividing resistors, wherein the detecting includes applying a predetermined voltage between corresponding two adjacent test pads so as to apply a forward bias to a corresponding diode so that a current path is formed between the corresponding two adjacent test pads through the one of the voltage dividing resistors and the corresponding diode; and detecting a current leakage resistance of one of the capacitors, wherein the detecting includes applying a predetermined voltage between corresponding two adjacent test pads so as to apply a reverse bias to a corresponding diode so that a current path is formed between the corresponding two adjacent test pads through the one of the capacitors.

In the above method, when the resistance of the voltage dividing resistor is detected, the current does not flow through the capacitor. Further, when the current leakage of the capacitor is detected, the current does not flow through the voltage dividing resistor. Thus, the device can detect the resistance of the voltage dividing resistor and the current leakage of the capacitor with high accuracy.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
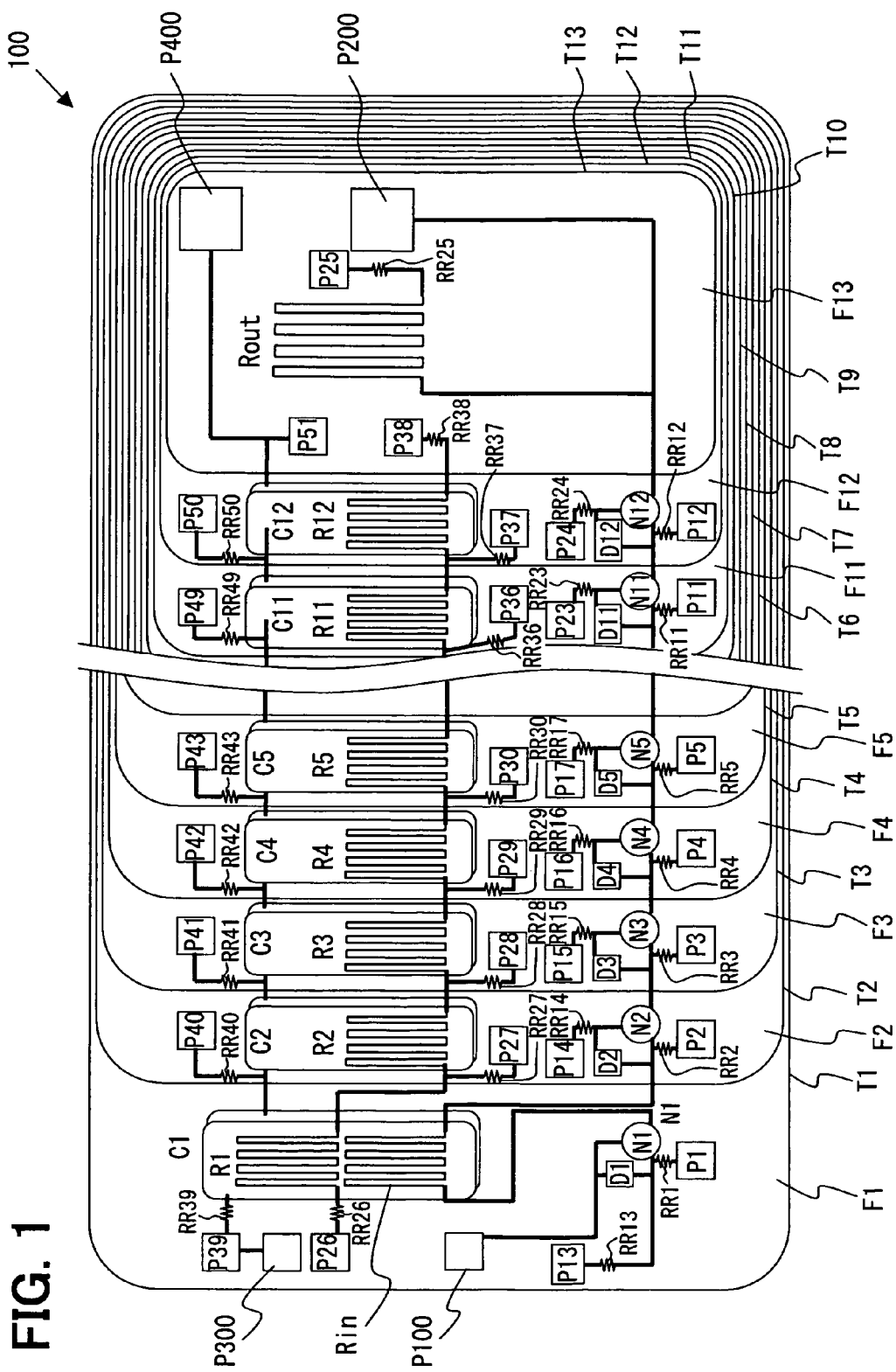
FIG. 1 is a plan diagram showing the general configuration of a semiconductor device of a first embodiment.
Figure 2:
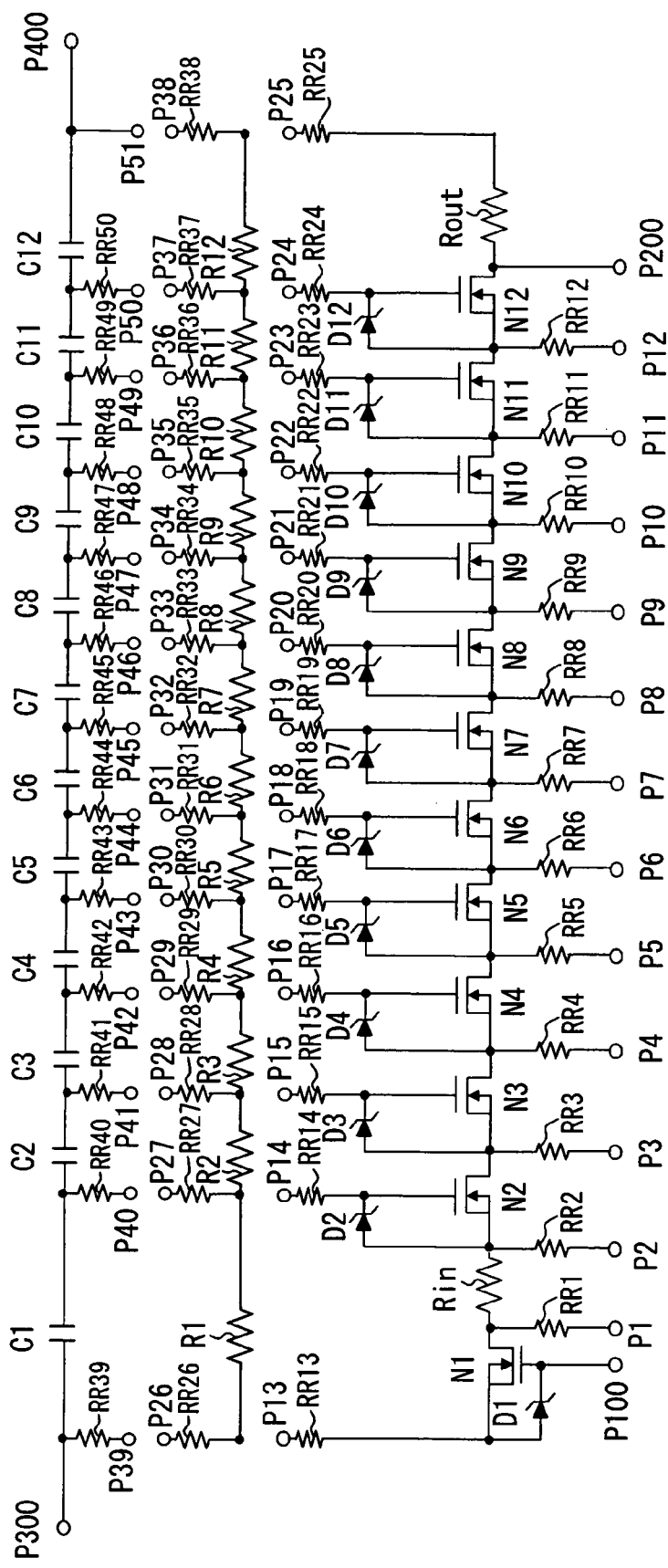
FIG. 2 is a diagram of an equivalent circuit, before testing, of the semiconductor device.
Figure 3:
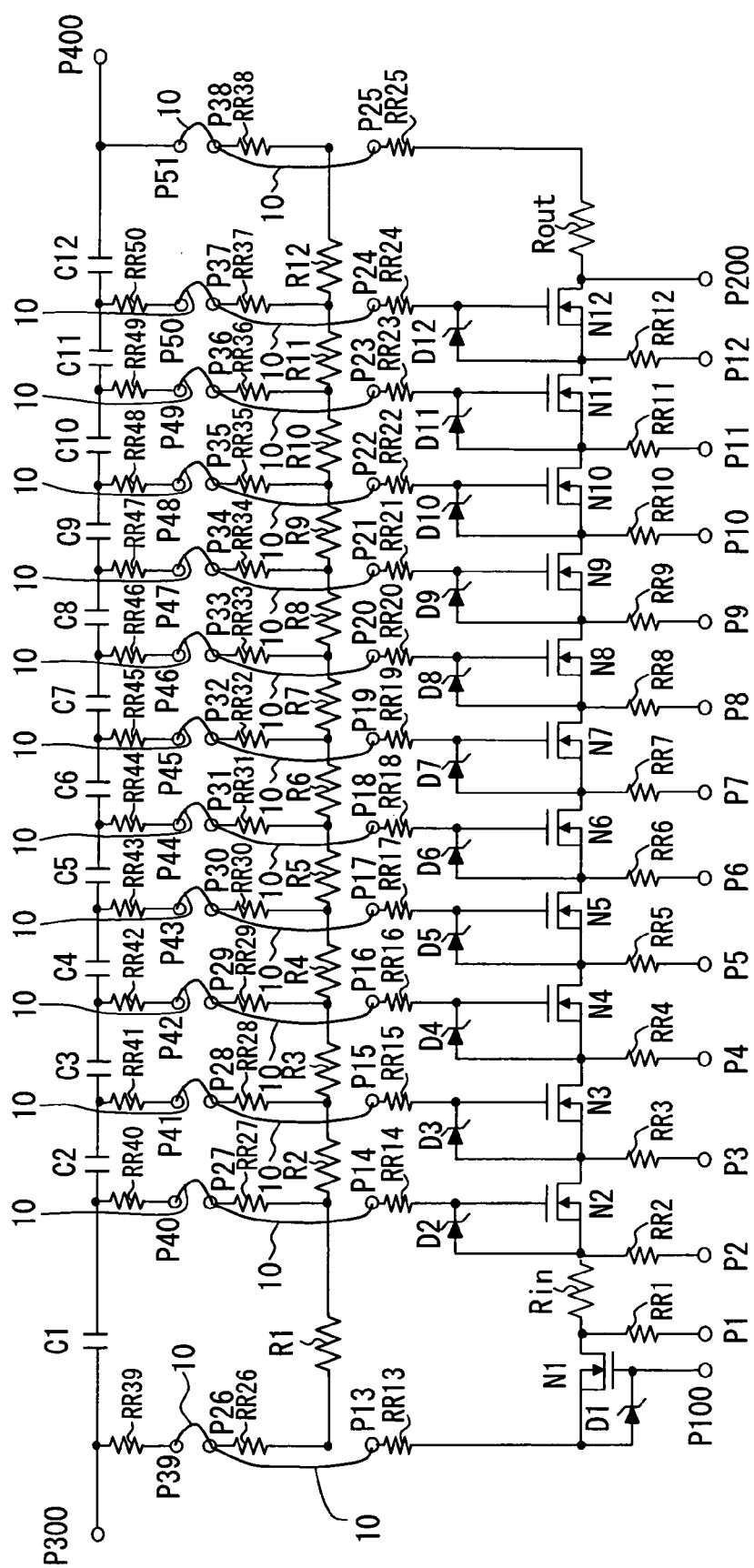
FIG. 3 is a diagram of the equivalent circuit, after testing, of the semiconductor device.

Below, a first embodiment will be described on the basis of the drawings. FIG. 1 is a plan diagram showing the general configuration of a semiconductor device of the first embodiment. FIG. 2 is a diagram of an equivalent circuit, before testing, of the semiconductor device. FIG. 3 is a diagram of the equivalent circuit, after testing, of the semiconductor device.

The present embodiment will be describing using an example where the semiconductor device is applied to a level shift circuit that level-shifts an input signal between a GND potential and a high potential. A semiconductor device 100 pertaining is a semiconductor device 100 of a configuration where n transistor elements that are formed on a semiconductor layer of an SOI structure semiconductor substrate including an embedded oxide film and which are insulated and separated from each other by n (n≧2) element separating trenches that reach the embedded oxide film are sequentially series-connected between a first predetermined potential and a second predetermined potential that is different from the first predetermined potential, with the transistor element near the first predetermined potential serving as a first stage transistor element and the transistor element near the second predetermined potential serving as an n-th stage transistor element, and with the gate terminal of the first stage transistor element serving as an input terminal, and where n resistive elements and capacitive elements are sequentially series-connected between the first predetermined potential and the second predetermined potential, with the resistive element and the capacitive element near the first predetermined potential serving as a first stage resistive element and a first stage capacitive element and the resistive element and the capacitive element near the second predetermined potential serving as an n-th stage resistive element and an n-th stage capacitive element, and where the gate terminals of the transistor elements of each stage excluding the first stage transistor element are sequentially connected between the series-connected resistive elements and capacitive element of each stage, and where an output is removed from the terminal of the n-th stage transistor element near the second predetermined potential.

As shown in FIG. 1 and FIG. 2 and the like, in the present embodiment, N-channel type lateral double-diffused MOS (LDMOS) are employed as the n (n≧2) transistor elements N1 to Nn (in the present embodiment, N1 to N12, which will also be called N1 to N12 below). The transistor elements N1 to N12 are formed on a semiconductor layer (not shown) on an embedded oxide film (not shown) and are surrounded and insulated and separated from their surroundings by element separating trenches that reach the embedded oxide film. The transistor elements N1 to N12 are series-connected in multiple stages. Additionally, Zener diodes D1 to Dn (in the present embodiment, D1 to D12, which will also be called D1 to D12 below) are connected between the gates and sources of the n transistor elements N1 to Nn.

Further, as shown in FIG. 1 and FIG. 2 and the like, transistor-use pads (also called pads P1 to P25 below), at least parts of which for performing electrical connection with other elements are exposed to the outside, are connected to the terminals (drains, gates, sources) of the transistor elements N1 to N12. Specifically, the transistor-use pads are connected to the gates of the transistor elements N1 to N12, the source of the first stage transistor N1, the drain of the n-th stage transistor Nn (N12), and between the transistor elements of the second transistor N2 and the n-th stage transistor Nn (N12). For example, in the case of the transistor N2, the pad P1 is connected to the gate thereof, the pad P2 is connected to the source thereof, and the pad P3 is connected to the drain thereof. Further, the pad P3 is also connected to the source of the transistor N3.

An input pad P100 is connected to the gate of the first stage transistor N1, and an output pad P200 is connected to the drain of the n-th stage transistor Nn (N12). Further, one terminal of an input resistor Rin is connected to the source of the second stage transistor N2, and the drain of the first stage transistor N1 is connected to the other terminal of the input resistor Rin.

Further, field separating trenches Tn (in the present embodiment, T1 to T12, which will also be called T1 to T12 below) that reach the embedded oxide film are multiply formed in the semiconductor layer (not shown) of the semiconductor device 100, and the n transistor elements N1 to Nn are sequentially disposed one at a time in field regions F1 to Fn (in the present embodiment, F1 to F12, which will also be called F1 to F12 below) that are surrounded by the field separating trenches T1 to T12. The gates of the transistor elements N1 to N12 fix the field potential of the field regions F1 to F12.

Further, in the present embodiment, a field separating trench T13 (Tn+1) that reaches the embedded oxide film is also formed in the region surrounded by the field separating trench T12. In a field region F13 (Fn+1) that is surrounded by the field separating trench T13, a high potential reference circuit is formed. Further, in the field region F1 that is surrounded by the field separating trench T1, a GND reference circuit is formed.

Moreover, in the semiconductor device 100, as shown in FIG. 1 and FIG. 2 and the like, n resistive elements R1 to Rn (in the present embodiment, R1 to R12, which will also be called R1 to R12 below) are series-connected in multiple stages, and n capacitive elements C1 to Cn (in the present embodiment, C1 to C12, which will also be called C1 to C12 below) are series-connected in multiple stages. Additionally, resistor-use pads (also called pads P26 to P38 below), at least parts of which for performing electrical connection with other elements are exposed to the outside, are connected between the resistive elements R1 to R12 of each stage and to both ends of the series-connected n resistive elements R1 to R12 (the terminals of the resistive elements R1 and R12). Capacitor-use pads (also called pads P39 to P51 below), at least parts of which for performing electrical connection with other elements are exposed to the outside, are connected between the capacitive elements C1 to C12 of each stage and to both ends of the series-connected n capacitive elements C1 to C12 (the terminals of the capacitive elements C1 and C12). The pad 39 is also connected to a source pad P300, and the pad 51 is also connected to a drain pad P400.

Consequently, in the semiconductor device 100, the gates of the transistor elements N2 to N12 of each stage excluding the first stage transistor element N1, the resistive elements R1 to R12 of each stage, and the capacitive elements C1 to C12 of each stage are electrically connectable, and both ends of the twelve series-connected transistor elements N1 to N12, both ends of the twelve series-connected resistive elements R1 to R12, and both ends of the twelve series-connected capacitive elements C1 to C12 are electrically connectable.

Here, testing in the semiconductor device 100 will be described. In the semiconductor device 100 of the above-described configuration, the capacitance withstand voltage leak current of the capacitive elements C1 to C12, the resistance absolute values of the resistive elements R1 to R12, the inter-drain-source withstand voltage leak current of the transistor elements N1 to N12, and the leak current between the trenches T1 to T12 (the field regions F1 to F12) of each stage can be tested.

In the case of performing testing of the capacitance withstand voltage leak current of the capacitive elements C1 to C12, a voltage is applied between the source pad P300 and the drain pad P400 connected to both ends of the series-connected capacitive elements C1 to C12 and measured.

In the case of performing testing of the resistance absolute values of the resistive elements R1 to R12, a voltage is applied between the terminals of the resistive elements R1 to R12 and measured. For example, in the case of the resistive element R2, a voltage is applied between the pad P27 and the pad P28 and measured.

In the case of testing the inter-drain-source withstand voltage leak current of the transistor elements N1 to N12, the gate terminals of the transistor elements N1 to N12 are placed at 0 V, and a proof voltage is applied between the drains and sources and measured. For example, in the case of the transistor element N2, the pad P14 is placed at 0 V, and a proof voltage is applied between the pad P2 and the pad P3 and measured.

In the case of measuring the leak current between the trenches T1 to T12 (the field regions F1 to F12) of each stage, the gate terminals of the transistor elements N1 to N12 fix the field potentials of the field regions F1 to F12 of each stage, so this is utilized to apply and measure a voltage between the field regions F1 to F12 (e.g., the pad P14 and the pad P15) of each stage.

After testing each transistor element N1-N12, a Cr—Si thin film resistor RR1 disposed between the transistor-use pad P1 and the first stage transistor element N1 or the Zener diode D1 is irradiated with the laser so that the resistor RR1 is cut off. Similarly, other Cr—Si thin film resistors RR2-RR12 disposed between the transistor-use pads P2-P12 and the second to twelfth stage transistor elements N2-N12 or the Zener diodes D2-D12 are also irradiated with the laser so that the resistors RR2-RR12 are cut off. Thus, each transistor-use pad P1-P12 are disconnected to the transistor element N1-N12, so that it is prevented from forming a parasitic capacitance between the transistor-use pad P1-P12 and the first to twelfth stage transistor element N1-N12 or the Zener diode D1-D12. Accordingly, the switching characteristics of the device are not deteriorated by the parasitic capacitance.

Further, in the semiconductor device 100 where testing of element units has ended, as shown in FIG. 3, the pads P3 to P51 are connected by wires (conductive connection members) 10. Specifically, in the semiconductor device 100, the transistor-use pads (the pads P14 to P24) connected to the gates of the transistor elements N2 to N12 of each stage excluding the first stage transistor element N1, the resistor-use pads (the pads P27 to P37) connected between the resistive elements R1 to R12 of each stage, and the capacitor-use pads (the pads P40 to P50) connected between the capacitive elements C1 to C12 of each stage are electrically connected by the wires 10, and the transistor-use pads (the pads P13 and P25) connected to both ends of the series-connected transistor elements N1 to N12, the resistor-use pads (the pads P26 and P38) connected to both ends of the series-connected resistive elements R1 to R12, and the capacitor-use pads (the pads P39 and P51) connected to both ends of the series-connected capacitive elements C1 to C12 are electrically connected by the wires 10.

That is, the gates of the transistor elements N2 to N12 of each stage excluding the first stage transistor element N1 are sequentially connected via the wires 10 between the series-connected resistive elements R1 to R12 and capacitive elements C1 to C12 of each stage. Additionally, the source of the first stage transistor element N1 is connected via the wire 10 between the first stage resistive element R1 and the first stage capacitive element C1, and the drain of the n-th stage transistor element N12 is connected via the wire 10 between the n-th stage resistive element R12 and the n-th stage capacitive element C12.

In other words, the pads P1 to P51 double as testing pads used when testing the semiconductor device 100 and as actual use pads used when actually using the semiconductor device 100 (connection pads that electrically connect the transistor elements N1 to N12, the resistive elements R1 to R12, and the capacitive elements C1 to C12).

The wires 10 may also be configured to electrically connect via leads. By configuring the wires 10 in this manner, the wires 10 can easily connect even when the intervals between the pads P1 to P51 are narrow.

In the semiconductor device 100, the voltage between the GND potential and the high potential is divided by the n transistor elements N1 to Nn, and the transistor elements N1 to Nn from the first stage to the n-th stage share their voltage regions. Consequently, the DC withstand voltage required of the transistor elements N1 to N12 can be reduced in comparison to when the voltage between the GND potential and the high potential is shared by one transistor element. Because only one of the n field separating trenches T1 to T12 is present between the adjacent insulated and separated transistor elements N1 to N12, connection wiring of the n transistor elements N1 to N12 becomes easy, the occupied area can be reduced, and the semiconductor device 100 can be made compact. In the semiconductor device 100, it is preferable for the n transistor elements N1 to Nn to have the same withstand voltage. Thus, the voltage (withstand voltage) shared by the transistor elements N1 to Nn inserted between the GND potential and the high potential can be equalized and minimized.

The semiconductor device 100 pertaining to the present embodiment is suitable for a level shift circuit that uses a predetermined power supply potential as a floating potential in a high-voltage IC for driving an inverter (e.g., a high-voltage IC for driving an inverter of an in-vehicle motor, a high-voltage IC for driving an inverter of an in-vehicle air conditioner). Further, the semiconductor device 100 is not limited to this and can also be applied to commercial and industrial motor control fields.

Here, a method of fabricating the semiconductor device 100 will be described. First, on a semiconductor layer of an SOI structure semiconductor substrate having an embedded oxide film, there are formed the n (n≧2) transistor elements N1 to Nn, the n resistive elements R1 to Rn, the input resistor Rin, the output resistor Rout, the n capacitive elements C1 to Cn, and the n field separating trenches T1 to T12 that reach the embedded oxide film. Then, the transistor-use pads (the pads P13 and P25), the resistor-use pads (the pads P26 to P38), the capacitor-use pads (P39 to P51), the input pad P100, the output pad P200, the source pad P300, and the drain pad P400 are formed such that at least parts thereof are exposed to the outside. In this manner, the semiconductor device 100 shown in FIG. 1 is formed.

Next, testing of element (the transistor elements N1 to N12, the resistive elements R1 to R12, and the capacitive elements C1 to C12) units is performed using the transistor-use pads (the pads P1 to P25), the resistor-use pads (the pads P26 to P38), and the capacitor-use pads (the pads P39 to P51) (testing step). Specifically, testing of the capacitance withstand voltage leak current of the capacitive elements C1 to C12, the resistance absolute value of the resistive elements R1 to R12, the inter-drain-source withstand voltage leak current of the transistor elements N1 to N12, and the leak current between the trenches T1 to T1 (the field regions F1 to F12) of each stage is performed.

Then, when the testing step ends, (with respect just to the semiconductor device 100 judged to be good in the testing step) the pads P1 to P51 are electrically connected by performing wire-bonding using the wires 10 (connecting step).

In this manner, by disposing the transistor-use pads (the pads P1 to P25), the resistor-use pads (the pads P26 to P38), and the capacitor-use pads (the pads P39 to P51), testing of element (the transistor elements N1 to N12, the resistive elements R1 to R12, and the capacitive elements C1 to C12) units can be performed using these pads.

Moreover, by performing testing in element units in this manner, endurance deterioration of the element units and characteristic fluctuations can be prevented, and there can be configured the high-reliability semiconductor device 100.

(Modification 1)

Figure 4:
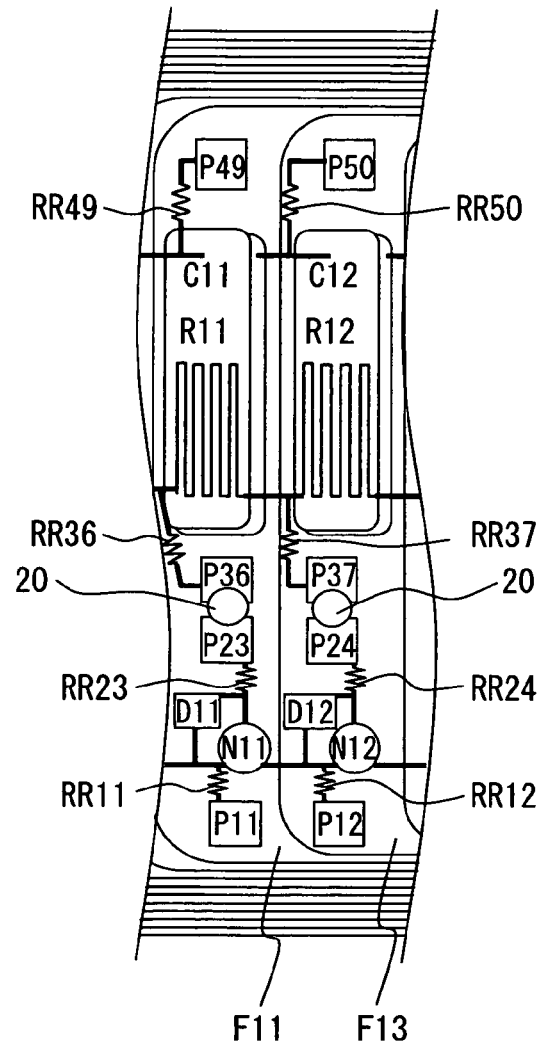
FIG. 4 is a plan diagram showing the general configuration of a semiconductor device of modification 1 of the first embodiment.

FIG. 4 is a plan diagram showing the general configuration of a semiconductor device of modification 1. As shown in FIG. 4, the pads P1 to P51 may also be connected using conductive balls 20 that are conductive spheres as connection members. Even by configuring the semiconductor device in this manner, testing of element (the transistor elements N1 to N12, the resistive elements R1 to R12, and the capacitive elements C1 to C12) units can be performed. Moreover, by performing testing in element units in this manner, endurance deterioration of the element units and characteristic fluctuations can be prevented, and there can be configured the high-reliability semiconductor device 100.

Further, in addition to this, although they are not shown, the pads may also be connected by conductive plate-like bodies or by vapor-depositing tungsten or the like.

(Modification 2)

Figure 5:
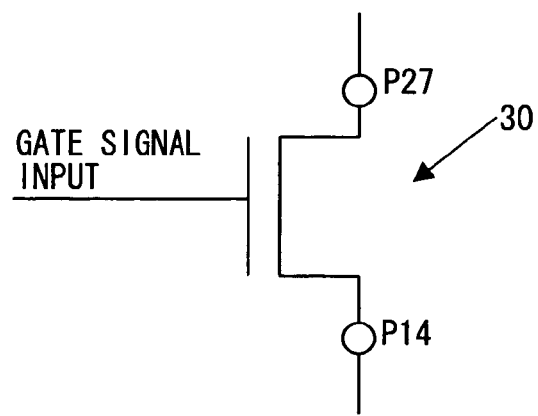
FIG. 5 is a plan diagram showing the general configuration of a semiconductor device of modification 2 of the first embodiment.

FIG. 5 is a plan diagram showing the general configuration of a semiconductor device of modification 2. As shown in FIG. 5, the pads P1 to P51 may also be connected using switch elements (e.g., depression type transistors) 30. In this case, when the semiconductor device 100 is to be tested, the switches 30 are switched to a non-conducting state, and when the semiconductor device 100 is to be actually used, the switches 30 are switched to a conducting state. Even by configuring the semiconductor device in this manner, testing of element (the transistor elements N1 to N12, the resistive elements R1 to R12, and the capacitive elements C1 to C12) units can be performed. Moreover, by performing testing in element units in this manner, endurance deterioration of the element units and characteristic fluctuations can be prevented, and there can be configured the high-reliability semiconductor device 100. Further, in the case of modification 2, the connecting step can be easily performed simply by switching the switching elements 30 between the non-conducting state and the conducting state, which is preferable.

(Modification 3)

Figure 6:
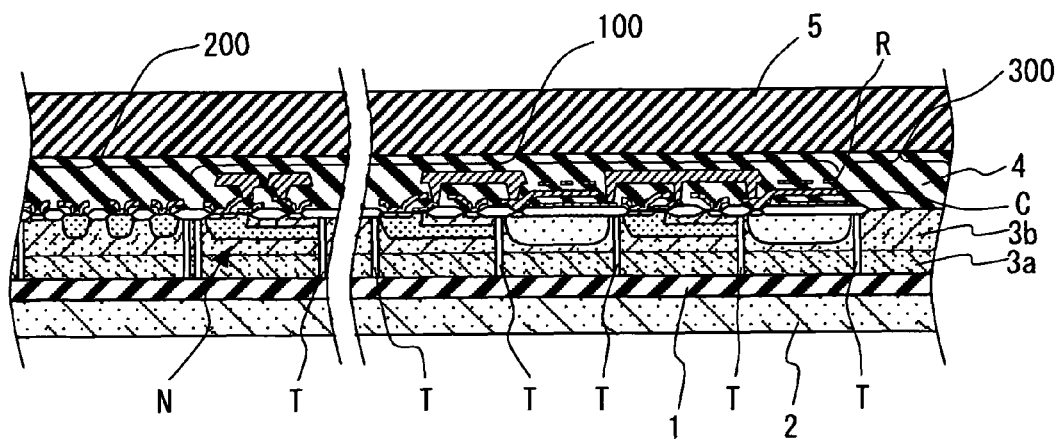
FIG. 6 is a plan diagram showing the general configuration of a semiconductor device of modification 3 of the first embodiment.
Figure 7:
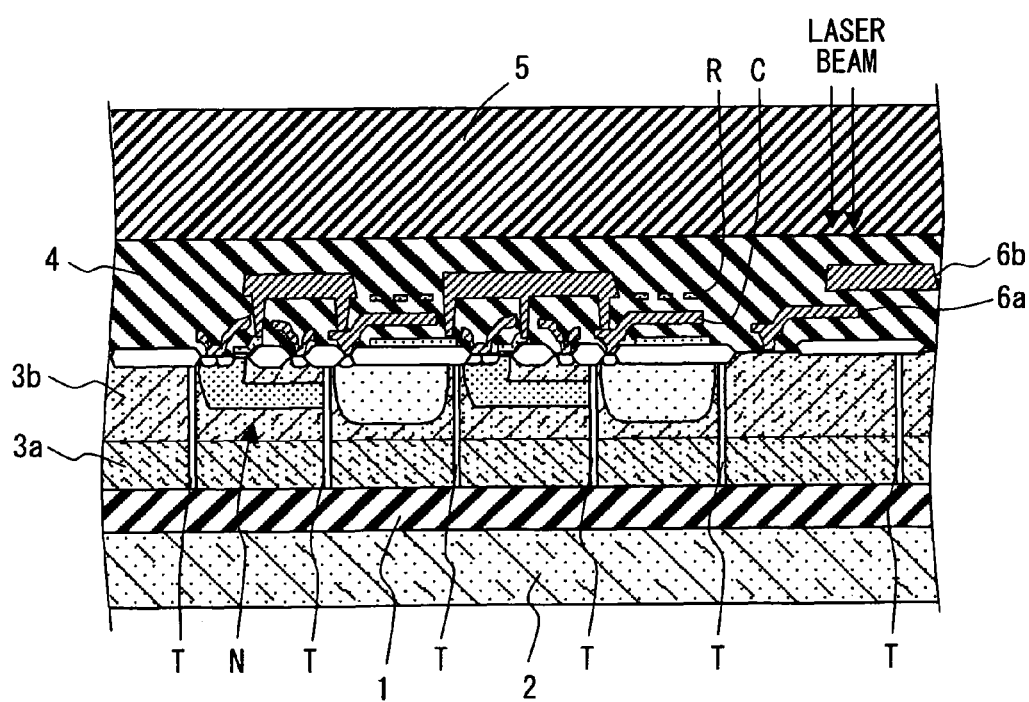
FIG. 7 is a partially enlarged diagram of FIG. 6.

FIG. 6 is a plan diagram showing the general configuration of a semiconductor device of modification 3. FIG. 7 is a partially enlarged diagram of FIG. 6. The point of difference between modification 3 and the preceding embodiment is the method of interconnecting the elements. Consequently, this point of difference will be described with emphasis.

As shown in FIG. 6, the semiconductor device 100 is formed on an SOI structure semiconductor substrate (support substrate 1, semiconductor layers (N+ layer 3a, N− layer 3b)) having an embedded oxide film 1. On this SOI semiconductor substrate, n transistor elements N (N1 to Nn) that are insulated and separated from each other by n (n≧2) element separating trenches T that reach an embedded oxide film 1, n resistive elements R (R1 to Rn), n capacitive elements (C1 to Cn), a GND potential reference circuit 200, and a high potential reference circuit 300 and the like are formed. Further, wires (1st Al layer 6a, 2nd Al layer 6b) comprising Al, for example, are laminated on the SOI structure semiconductor substrate via an interlayer insulating film 4 comprising SiO2 or the like.

Additionally, at least parts of wires connecting to the gates of the transistor elements of each stage excluding the first stage transistor element, wires connecting between the series-connected resistive elements of each stage, and wires connecting between the series-connected capacitive elements of each stage are laminated via an insulating film, and at least parts are connected to the pads P14 to P24, P27 to P37, and P40 to P50.

Further, at least parts of wires connecting to both ends of the series-connected n transistor elements, wires connecting to both ends of the series-connected n resistive elements, and wires connecting to both ends of the series-connected n capacitive elements are laminated via an insulating film, and at least parts are connected to the pad P13, the pad P26, the pad P38, the pad P39, and the pad P51.

Additionally, after testing (testing step) has been performed on the element units using the pads P1 to P51, as shown in FIG. 7, the laminated wires (1st Al layer 6a, 2nd Al layer 6b) are irradiated with laser light or the like, whereby the material of the wires (1st Al layer 6a, 2nd Al layer 6b) is dispersed in the interlayer insulating film 4, whereby the mutual wires (1st Al layer 6a, 2nd Al layer 6b) are electrically connected (connecting step).

Even by configuring the semiconductor device in this manner, the gates of the transistor elements of each stage excluding the first stage transistor element are sequentially connected between the series-connected resistive elements and capacitive elements of each stage. Additionally, the source of the first stage transistor element is connected between the first stage resistive element and the first stage capacitive element, and the drain of the n-th stage transistor element is connected between the n-th stage resistive element and the n-th stage capacitive element.

Even by configuring the semiconductor device in this manner, testing of element (the transistor elements N, the resistive elements R, and the capacitive elements C) units can be performed. Moreover, by performing testing in element units in this manner, endurance deterioration of the element units and characteristic fluctuations can be prevented, and there can be configured the high-reliability semiconductor device 100.

(Modification 4)

Figure 8:
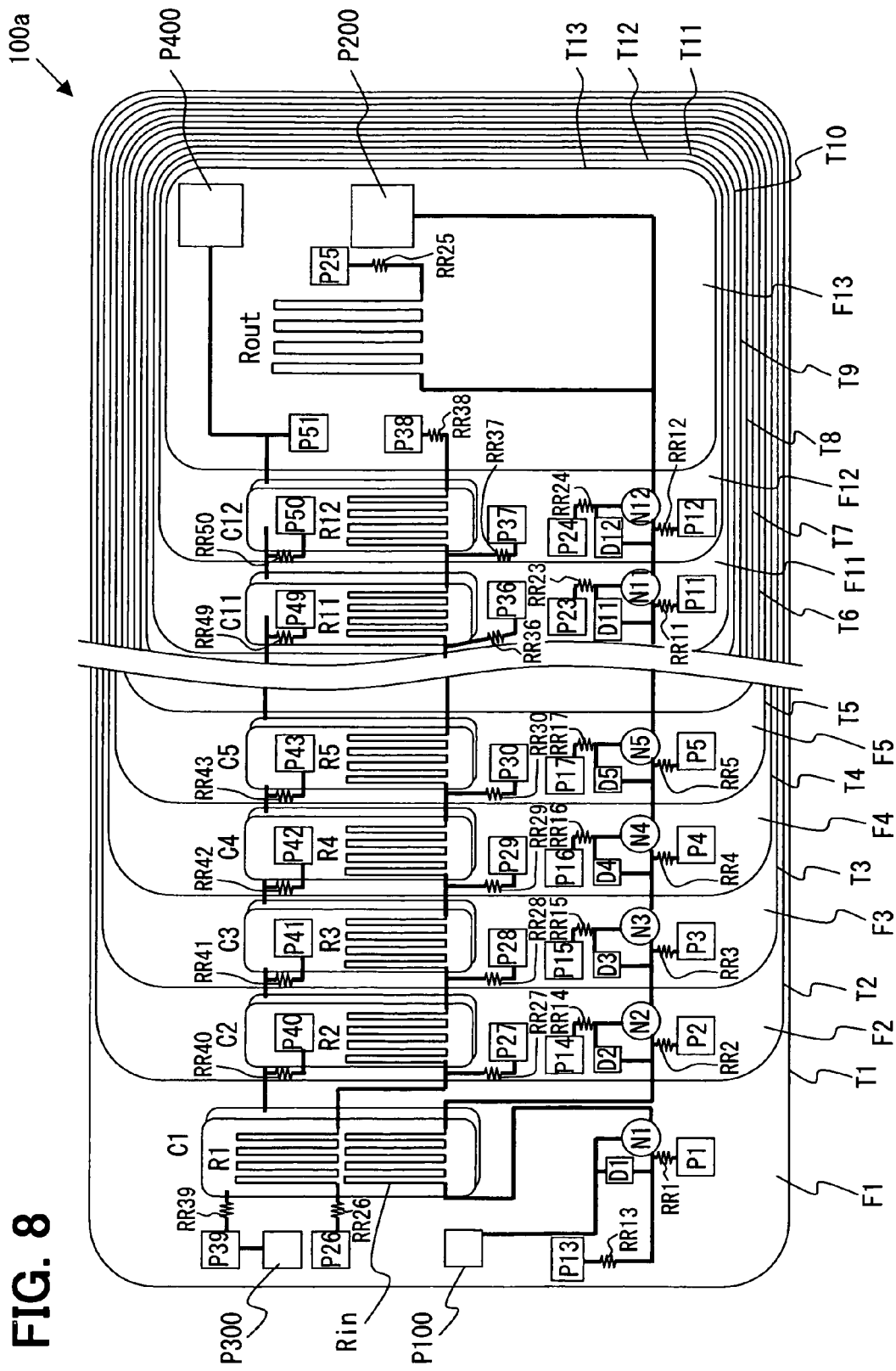
FIG. 8 is a plan diagram showing the general configuration of a semiconductor device of modification 4 of the first embodiment.

FIG. 8 is a plan diagram showing the general configuration of a semiconductor device of modification 4. As shown in FIG. 8, in a semiconductor device 100a, the capacitor-use pads (the pads P40 to P50) connected between the capacitive elements are disposed on the upper side of the capacitive elements C1 to C12. By configuring the semiconductor device in this manner, the surface of the semiconductor device 100a can be effectively put to practical use by just the pads P40 to P50. In other words, ineffective regions of the semiconductor device 100a can be reduced.

Modification 4 has been described using an example where pads were disposed on the upper side of capacitive elements, but the same effect can be achieved by disposing pads on the upper side of the other transistor elements and resistive elements.

(Modification 5)

Figure 9:
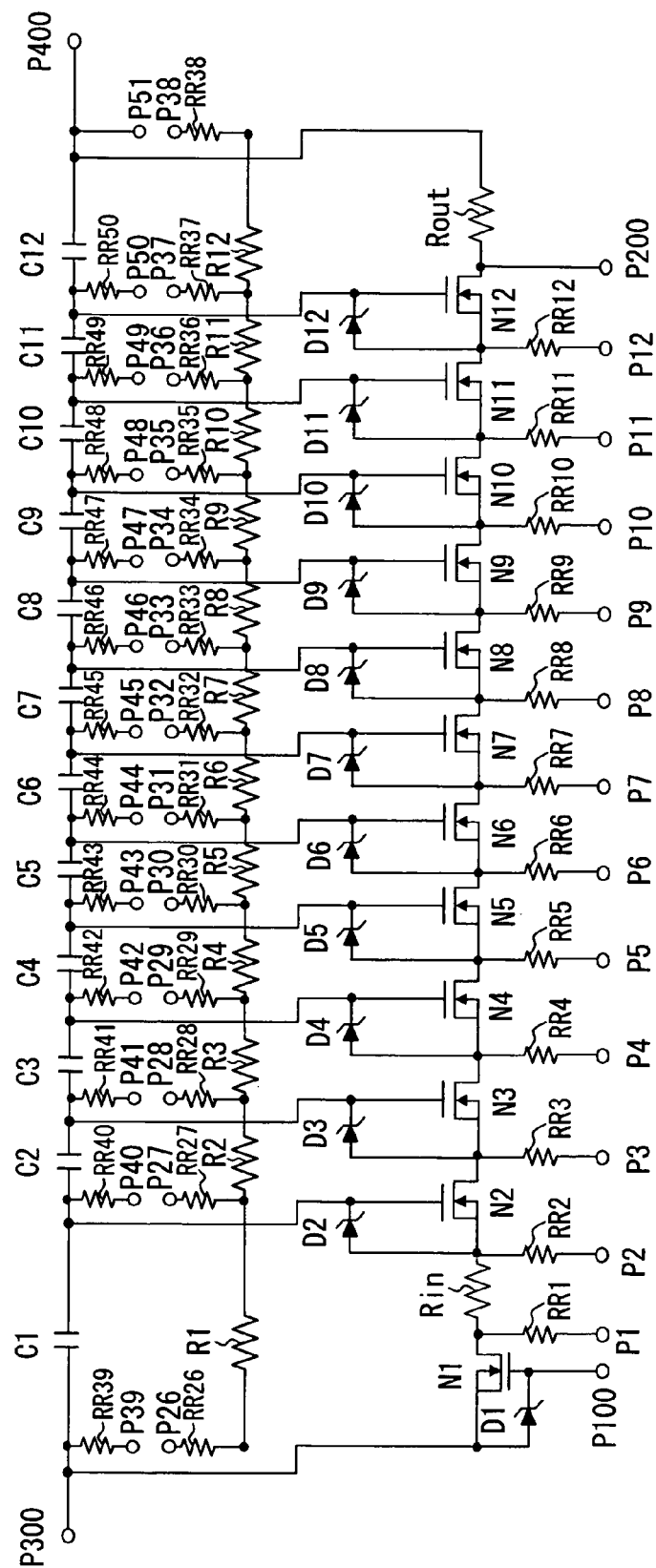
FIG. 9 is a plan diagram showing the general configuration of a semiconductor device of modification 5 of the first embodiment.
Figure 10:
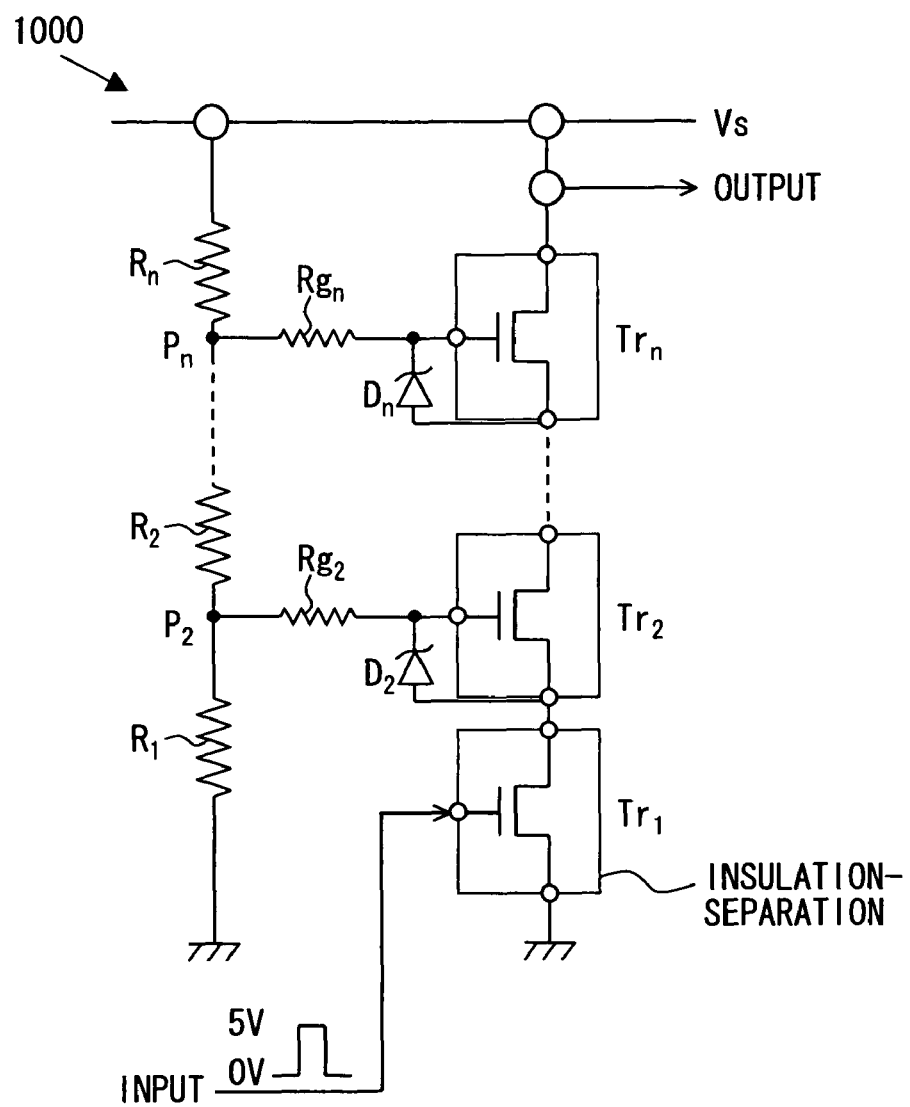
FIG. 10 is a diagram of an equivalent circuit of a semiconductor device in the prior art.

FIG. 9 is an equivalent circuit diagram showing the general configuration of a semiconductor device of modification 5. As shown in FIG. 9, the gates of the transistor elements N1 to N12 and the capacitive elements C1 to C12 may also be connected by aluminum wires. By configuring the semiconductor device in this manner, the number of pads can be reduced (P13 to P25 can be omitted).

In the present embodiment, an example employing LDMOS as the transistor elements N1 to Nn has been described. However, MOS transistor elements other than LDMOS can also be employed. Further, insulated gate bipolar transistor (IGBT) elements can also be employed other than MOS transistor elements.

Second Embodiment

A semiconductor device described in the present embodiment is applied as a level shift element for performing signal transmission between a low-voltage region of 15 V, for example, and a high-voltage region of 600 V, for example.

Figure 11:
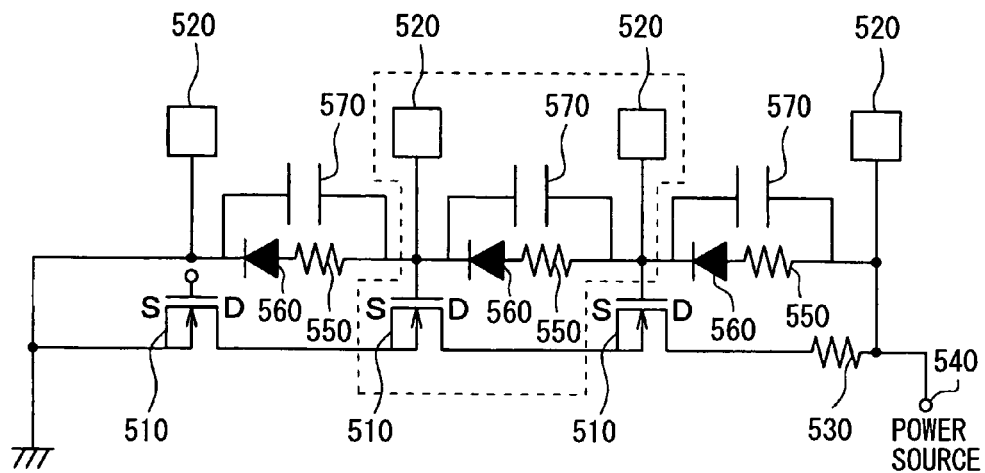
FIG. 11 is a diagram showing an equivalent circuit of a semiconductor device pertaining to a second embodiment.

FIG. 11 is a diagram showing an equivalent circuit of the semiconductor device. As shown in this diagram, Nch type LDMOS transistors 510 are connected in plural stages. Further, a test pad 520 is connected to each gate of each of the LDMOS transistors 510.

Of the LDMOS transistors 510, an input signal is inputted from the outside to the gate of the LDMOS transistor whose source is connected to a ground. Additionally, the drain of the highest stage LDMOS transistor 510 of the LDMOS transistors 510 is connected to a power supply 540 via a resistor 530. A voltage applied to the resistor 530 is outputted to the outside as an output signal.

Further, a voltage dividing resistor 550 and a diode 560 are connected in series between each gate of each of the LDMOS transistors 510. Moreover, a smoothing capacitor 570 is connected between each gate of each of the LDMOS transistors 510. That is, the smoothing capacitors 570 are connected in parallel with the series connections between the voltage dividing resistors 550 and the diodes 560.

The voltage dividing resistors 550 divide the constant voltage of the power supply 540 in accordance with a resistance value. Further, the smoothing capacitors 570 function as resistors when the voltage dividing resistors 550 become unable to follow the voltage fluctuation of the power supply 540.

The diodes 560 are series-connected between each gate of each of the LDMOS transistors 510 to the voltage dividing resistors 550 such that their power supply 540 sides are anodes and their ground side are cathodes. That is, the diodes 560 are connected to the voltage dividing resistors 550 such that, when the circuit shown in FIG. 11 operates, the current flows to the voltage dividing resistors 550. This is the circuit connection mode of the semiconductor device pertaining to the present embodiment.

Figure 12:
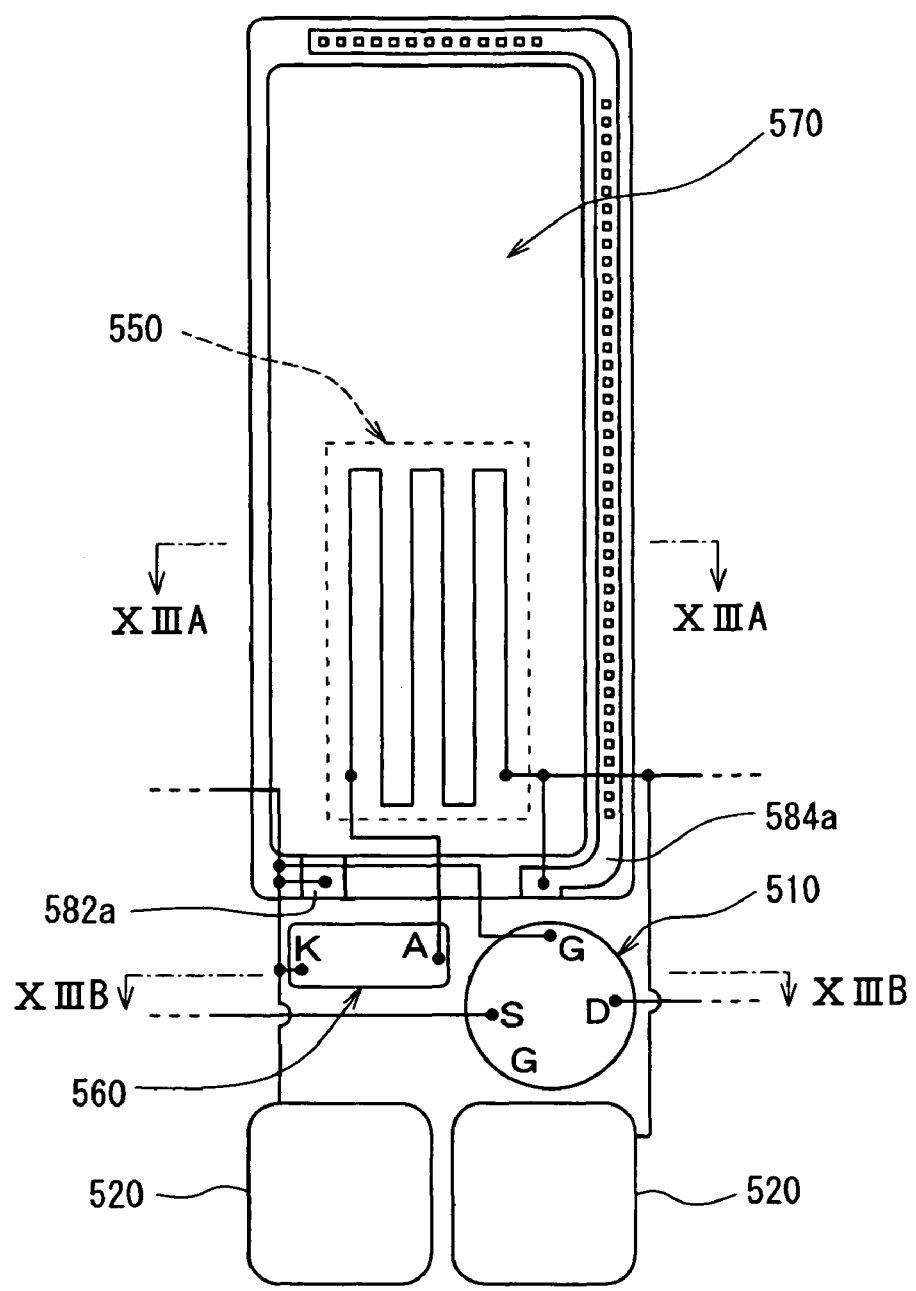
FIG. 12 is a diagram showing the planar layout of the dotted line portion of the semiconductor device shown in FIG. 1.
Figure 13A:
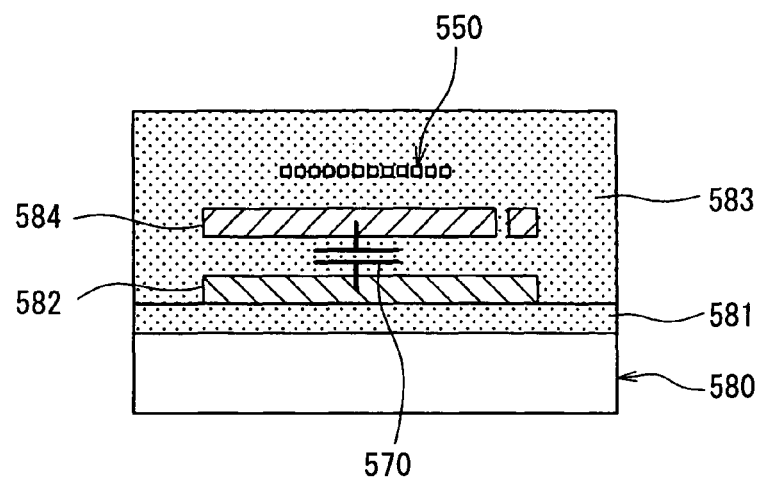
FIG. 13A is a cross-sectional diagram along XIIIA-XIIIA in FIG. 12.
Figure 13B:
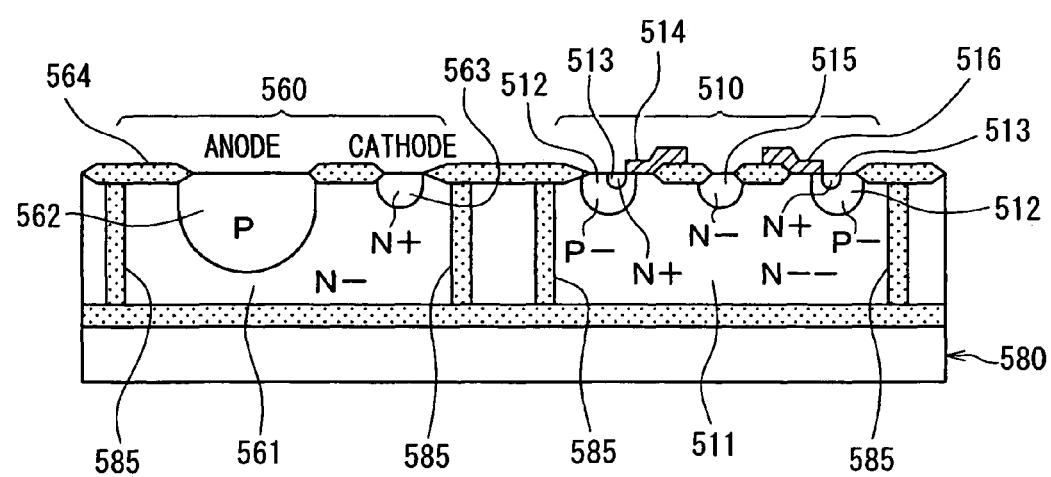
FIG. 13B is a cross-sectional diagram along XIIIB-XIIIB in FIG. 12.

FIG. 12 is a diagram showing the planar layout of the dotted line portion of the semiconductor device shown in FIG. 12. Further, FIG. 13A is a cross-sectional diagram along XIIIA-XIIIA in FIG. 12, and FIG. 13B is a cross-sectional diagram along XIIIB-XIIIB in FIG. 12. As shown in FIG. 12, a resistor material of the voltage dividing resistors 550 is disposed wave-like.

As shown in FIG. 13A, a LOCOS film 581 is formed on a semiconductor substrate 580. As the semiconductor substrate 580, an SOI substrate, for example, is employed. Further, in FIG. 13A, the structure of the semiconductor substrate 580 is omitted.

Additionally, a polysilicon layer 582 is formed on the LOCOS film 581, and a metal layer 84 is formed via an interlayer film 583 on the polysilicon layer 582. That is, the smoothing capacitors 570 are configured by the polysilicon layer 582, the metal layer 584, and the interlayer film 583 interposed between the polysilicon layer 582 and the metal layer 584. Moreover, the voltage dividing resistors 550 are disposed via the interlayer film 583 on the metal layer 584. The voltage dividing resistors 550 are covered by the interlayer film 583.

As shown in FIG. 12, the polysilicon layer 582 includes a wire connection portion 582a, and the metal layer 584 also includes a wire connection portion 584a. These wire connection portions 582a and 584a are connected to multilayer wiring so as to become the circuit mode shown in FIG. 11.

Further, as shown in FIG. 13B, plural trenches 585 are formed in the semiconductor substrate 580, and regions are insulated and separated by the trenches 585. In regions of the semiconductor substrate 580 that correspond to the diodes 560, a P type region 562 serving as an anode and an N+ type region 563 serving as a cathode are disposed so as to be separated from each other on the top layer portion of an N− type layer 561, and the surface of the N− type layer 561 is covered by a LOCOS film 564 such that the P type region 562 and the N+ type region 563 are exposed.

On the other hand, in regions of the semiconductor substrate 580 that correspond to the LDMOS transistors 510, P− type regions 512 that are separate from each other are disposed in the top layer portion of an N−− type layer 511, and an N+ type region 513 is disposed in the top layer portion of each of the P− type regions 512. Further, an N− type region 514 is formed between each of the P− type regions 512. Additionally, one of the N+ type regions 513 serves as a source and the other serves as a drain, and a gate-use polysilicon layer 516 formed on a LOCOS film 515 serves as a gate.

The configuration shown in FIG. 12 configures one cell, and a plurality of these cells are arranged, whereby the semiconductor device is configured. Further, the LDMOS transistors 510 of the cells are insulated from each other by the trenches 585 and an unillustrated insulating layer. Additionally, the cells are electrically connected by unillustrated multilayer wiring formed on each cell. That is, in FIG. 11, the region enclosed by the dotted line corresponds to the one cell shown in FIG. 12.

Next, a method of fabricating the semiconductor device will be described. First, the semiconductor substrate 580 in the form of an SOI substrate is prepared, and the trenches 585 are formed in the semiconductor substrate 580 to section the silicon layer. Next, the diodes 560 and the LDMOS transistors 510 are formed by a known semiconductor process. At this time, the test pads 520 are also formed in the step of forming the diodes 560 and the LDMOS transistors 510.

Thereafter, the polysilicon layer 582, the interlayer film 583, the metal layer 584 and the voltage dividing resistors 550 are formed on the LOCOS film 581. In this case, wires connected to the wire connection portion 582a of the lower polysilicon layer 582 and to the wire connection portion 584a of the metal layer 584 are drawn to the upper layer portion through via holes or the like, for example. Additionally, multilayer wiring is formed on the upper layer portion of the semiconductor substrate 580 so as to become the connected state shown in FIG. 11.

In regard to the semiconductor device fabricated in this manner, a voltage dividing resistor testing step of testing the resistance value of the voltage dividing resistors 550 and a smoothing capacitor testing step of testing the leak current of the smoothing capacitors 570 is performed. Specifically, a voltage is applied between the test pads 520 connected to the gates of the LDMOS transistors 510, and this voltage is monitored to measure the resistance value of the voltage dividing resistors 550 or to test the leak current of the smoothing capacitors 570.

First, a voltage is applied to the test pads 520 so as to apply a forward bias to the diodes 560. Thus, because the current does not flow to the smoothing capacitors 570, a path leading through the voltage dividing resistors 550 and the diodes 560 is formed between the test pads 520. Thus, the resistance value of the voltage dividing resistors 550 is measured to test whether or not the resistance value of the voltage dividing resistors 550 satisfies a stipulated value.

Next, a voltage is applied to the test pads 520 so as to apply a backward bias to the diodes 560. Thus, because the current does not flow to the voltage dividing resistors 550, a path leading through the smoothing capacitors 570 is formed between the test pads 520. Thus, a leak current check of the smoothing capacitors 570 is performed by testing whether or not the leak current flowing to the smoothing capacitors 570 satisfies a stipulated value.

It will be noted that when the leak current in the backward direction of the diodes 560 is larger than the rating of the leak current of the smoothing capacitors 570, testing can also be performed by reducing the leak current of the diodes 560 at a low temperature.

Additionally, the above-described testing is performed in regard to all of the number of stages of the LDMOS transistors 510 shown in FIG. 11. In this manner, testing is performed in regard to whether or not the smoothing condensers 570 and the voltage dividing resistors 550 satisfy stipulated values. The semiconductor device shown in FIG. 11 is completed through this testing step.

Next, operation of the circuit shown in FIG. 11 will be described. First, as mentioned above, an input signal is inputted from the outside to the gate of the LDMOS transistor 510 whose source is connected to the ground. Below, this LDMOS transistor 510 will be called the first stage LDMOS transistor 510, and the LDMOS transistors 510 that are connected towards the power supply 540 will be called the second stage LDMOS transistor 510 and the third stage LDMOS transistor 510. In the present embodiment, the third stage LDMOS transistor 510 is the transistor of the highest stage closest to the power supply 540.

Specifically, when an input signal is inputted to the gate of the first stage LDMOS transistor 510, the drain potential of the first stage LDMOS transistor 510 drops. Because the source potential of the second stage LDMOS transistor 510 drops in accompaniment therewith, the potential between the gate and source of the second stage LDMOS transistor 510 rises and the second stage LDMOS transistor 510 is switched ON. In the same manner, the third stage LDMOS transistor 510 is switched ON as a result of the second stage LDMOS transistor 510 being switched ON. In this manner, all of the LDMOS transistors 510 can be switched ON at substantially the same time.

When all of the LDMOS transistors 510 have been switched ON in this manner, an output signal is outputted to the outside via the resistor 530 connected to the third stage LDMOS transistor 510 closest to the power supply 540.

As described above, in the present embodiment, the test pads 520 are connected to the gates of the LDMOS transistors 510 configuring a tandem structure. Moreover, the diodes 560 are series-connected to the voltage dividing resistors 550 such that, when the LDMOS transistors 510 are switched ON, the current flows to the voltage dividing resistors 550.

Thus, when the resistance value of the voltage dividing resistors 550 is to be tested, a voltage is applied to the test pads 520 so as to apply a forward bias to the diodes 560, whereby it can be ensured that the current does not flow to the smoothing capacitors 570. Further, because a path leading through the voltage dividing resistors 550 and the diodes 560 can be formed between the test pads 520, the resistance value of the voltage dividing resistors 550 can be tested.

Further, when the leak current of the smoothing capacitors 570 is to be tested, a voltage is applied to the test pads 520 so as to apply a backward bias to the diodes 560, whereby it can be ensured that the current does not flow to the voltage dividing resistors 50. Further, because a path leading through the smoothing capacitors 570 can be formed between the test pads 520, a leak current check as to whether or not a leak current is flowing to the smoothing capacitors 570 can be performed.

Third Embodiment

In the second embodiment, Nch type LDMOS transistors 510 were employed as the LDMOS transistors 510, but in the present embodiment, Pch type LDMOS transistors are employed.

Figure 14:
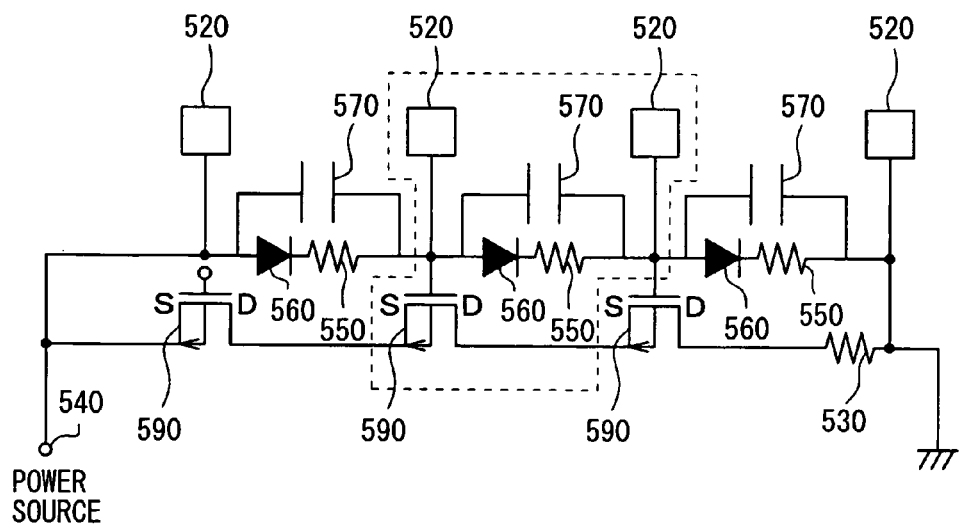
FIG. 14 is a diagram showing an equivalent circuit of a semiconductor device pertaining to a third embodiment.

FIG. 14 is a diagram showing an equivalent circuit of a semiconductor device pertaining to a third embodiment. As shown in this diagram, Pch type LDMOS transistors 90 are connected in plural stages. In this case also, similar to the first embodiment, the diodes 560 are series-connected to the voltage dividing resistors 550 such that the current flows to the voltage dividing resistors 550, and a test pad 520 is disposed on each gate of each of the LDMOS transistors 590. Thus, testing of the voltage dividing resistors 550 and the smoothing capacitors 570 is performed by the same method as in the second embodiment.

Fourth Embodiment

In each of the second and third embodiments, one smoothing capacitor 570 was connected between each gate of the LDMOS transistors 510, but in the present embodiment, other capacitors are connected in parallel in addition to the smoothing capacitors 570.

Figure 15A:
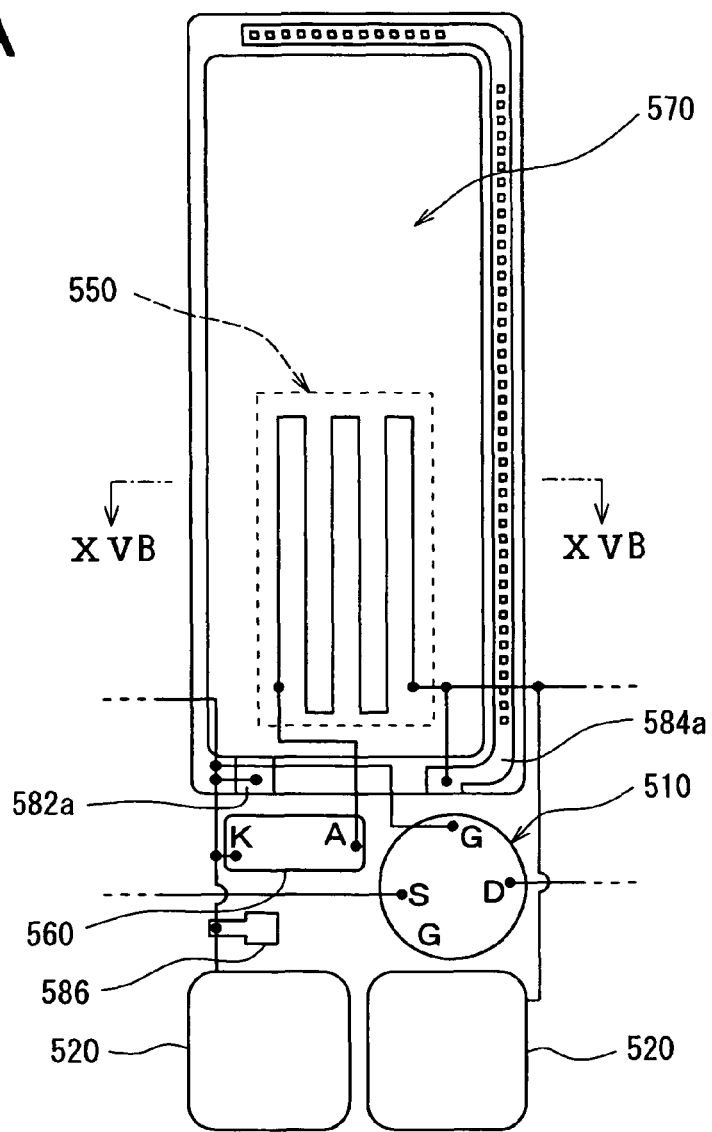
FIGS. 15A and 15B are diagrams showing a semiconductor device pertaining to a fourth embodiment, with FIG. 15A being a plan diagram and FIG. 15B being a cross-sectional diagram along XVC-XVC in FIG. 15A.
Figure 15B:
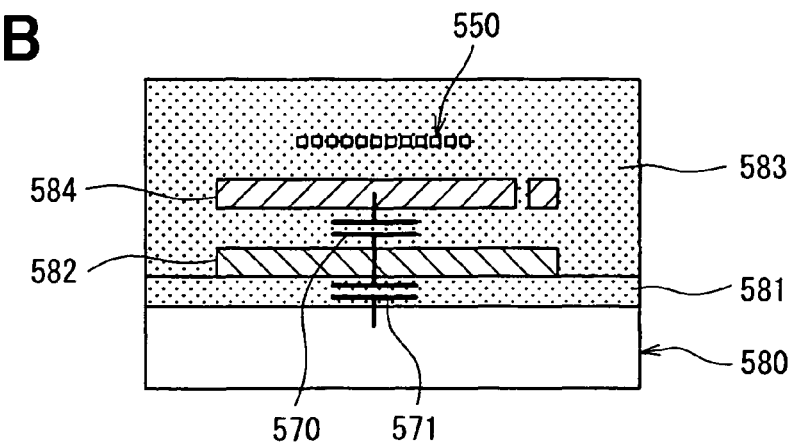

FIGS. 15A and 15B are diagrams showing a semiconductor device pertaining to a fourth embodiment, with FIG. 15A being a plan diagram and FIG. 15B being a cross-sectional diagram along XVC-XVC in FIG. 15A. As shown in FIG. 15A, an electrically connected wire connection portion 586 is disposed on the semiconductor substrate 580. The wire connection portion 586 is connected to the wire connection portion 582a that is the connection portion of the polysilicon layer 582 via multilayer wiring. That is, as shown in FIG. 15B, a capacitor 571 is configured by the polysilicon layer 582, the LOCOS film 581 and the semiconductor substrate 580.

As described above, the semiconductor substrate 580 and the polysilicon layer 582 are interconnected by wiring, whereby a smoothing capacitor can be added, and a circuit mode where the smoothing capacitors 570 and the capacitors 571 are connected in parallel between each of the gates can be configured.

Other Embodiments

In each of the second to fourth embodiments, the LDMOS transistors 510 are configured in three stages, but the number of stages can be set in accordance with the withstand current capacity that is necessary as a level shift element. Further, as the transistors configuring the tandem structure, insulated gate bipolar transistors (IGBT) can also be employed instead of the LDMOS transistors 510.

Figure 16:
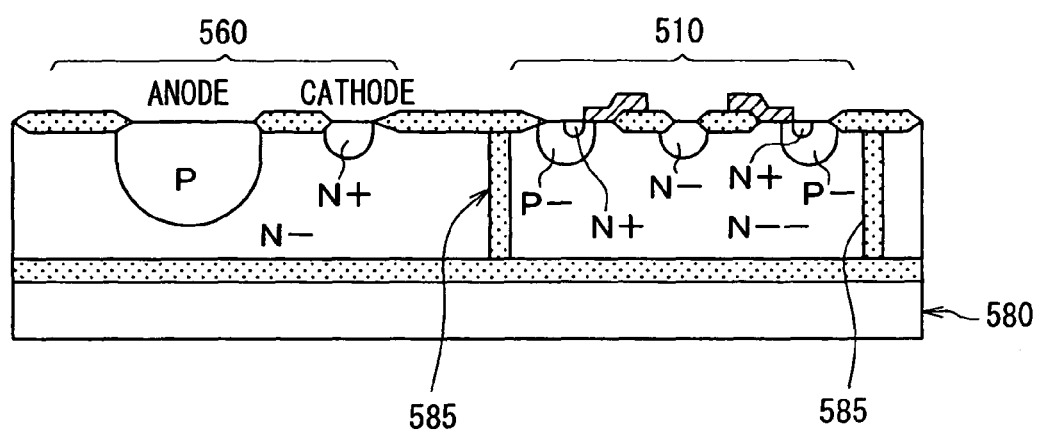
FIG. 16 is a diagram showing an example of the number of trenches that separate diodes and LDMOS transistors in another embodiment.

Further, as shown in FIG. 16, the number of trenches 585 that separate each adjacent pair of the diodes 560 and the LDMOS transistors 510 can be one.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
    a first terminal and a second terminal, wherein the first terminal has a predetermined first potential smaller than a predetermined second potential of the second terminal;
    n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element;
    n resistive elements that are sequentially coupled in series between the first terminal and the second terminal, wherein one resistive element nearest the first terminal is defined as a first stage resistive element, and another resistive element nearest the second terminal is defined as a n-th stage resistive element; and
    n capacitive elements that are sequentially coupled in series between the first terminal and the second terminal, wherein one capacitive element nearest the first terminal is defined as a first stage capacitive element, and another capacitive element nearest the second terminal is defined as a n-th stage capacitive element, wherein
    each transistor element includes a source, gate and a drain, the gate of each transistor element has a gate pad,
    each transistor element includes a pair of transistor pads, which are disposed on both sides of the transistor element,
    the gate pad of the first stage transistor element provides an input terminal,
    one of the transistor pads of the n-th stage transistor element disposed on the second terminal side provides an output terminal,
    each resistive element includes a pair of resistive pads, which are disposed on both sides of the resistive element,
    each capacitive element includes a pair of capacitive pads, which are disposed on both sides of the capacitive element,
    the gate pad of each transistor element other than the first stage transistor element, a corresponding one of the resistive pads between two adjacent resistive elements, and a corresponding one of the capacitive pads between two adjacent capacitive elements are electrically coupled together through a first conductive connection member,
    one of the transistor pads of the first stage transistor element disposed on the first terminal side, one of the resistive pads of the first stage resistive element disposed on the first terminal side, and one of the capacitive pads of the first stage capacitive element disposed on the first terminal side are electrically coupled with a second conductive connection member, and
    one of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side are electrically coupled with a third conductive connection member.

2. The semiconductor device according to claim 1, wherein the first to third conductive connection members are made of an electric lead.

3. The semiconductor device according to claim 1, wherein
    each transistor element is disposed in a corresponding field region so that n field regions are electrically isolated together, and
    each field region has an electric potential, which is stabilized with the gate of a corresponding transistor element.

4. The semiconductor device according to claim 1, wherein the gate and transistor pads in each transistor element are disposed over a corresponding transistor element, the pair of resistive pads in each resistive element are disposed over a corresponding resistive element, or the pair of capacitive pads in each capacitive element are disposed over a corresponding capacitive element.

5. The semiconductor device according to claim 1 wherein
    each of the gate and transistor pads in each transistor element includes a first thin film resistor, which is disposed between the transistor element and the pad,
    each of resistive pads in each resistive element includes a second thin film resistor, which is disposed between the resistive element and the pad, and
    each of capacitive pads in each capacitive element includes a third thin film resistor, which is disposed between the capacitive element and the pad.

6. A semiconductor device comprising:
    a first terminal and a second terminal, wherein the first terminal has a predetermined first potential smaller than a predetermined second potential of the second terminal;
    n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element;
    n resistive elements that are sequentially coupled in series between the first terminal and the second terminal, wherein one resistive element nearest the first terminal is defined as a first stage resistive element, and another resistive element nearest the second terminal is defined as a n-th stage resistive element; and
    n capacitive elements that are sequentially coupled in series between the first terminal and the second terminal, wherein one capacitive element nearest the first terminal is defined as a first stage capacitive element, and another capacitive element nearest the second terminal is defined as a n-th stage capacitive element, wherein
    each transistor element includes a source, gate and a drain,
    the gate of each transistor element has a gate pad, each transistor element includes a pair of transistor pads, which are disposed on both sides of the transistor element, the gate pad of the first stage transistor element provides an input terminal, one of the transistor pads of the n-th stage transistor element disposed on the second terminal side provides an output terminal, each resistive element includes a pair of resistive pads, which are disposed on both sides of the resistive element, each capacitive element includes a pair of capacitive pads, which are disposed on both sides of the capacitive element, the gate pad of each transistor element other than the first stage transistor element, a corresponding one of the resistive pads between two adjacent resistive elements, and a corresponding one of the capacitive pads between two adjacent capacitive elements are electrically coupled together through a first switching element, one of the transistor pads of the first stage transistor element disposed on the first terminal side, one of the resistive pads of the first stage resistive element disposed on the first terminal side, and one of the capacitive pads of the first stage capacitive element disposed on the first terminal side are electrically coupled with a second switching element, and one of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side are electrically coupled with a third switching element.

7. The semiconductor device according to claim 6, wherein each transistor element is disposed in a corresponding field region so that n field regions are electrically isolated together, and each field region has an electric potential, which is stabilized with the gate of a corresponding transistor element.

8. The semiconductor device according to claim 6, wherein the gate and transistor pads in each transistor element are disposed over a corresponding transistor element, the pair of resistive pads in each resistive element are disposed over a corresponding resistive element, or the pair of capacitive pads in each capacitive element are disposed over a corresponding capacitive element.

9. The semiconductor device according to claim 6, wherein each of the gate and transistor pads in each transistor element includes a first thin film resistor, which is disposed between the transistor element and the pad, each of resistive pads in each resistive element includes a second thin film resistor, which is disposed between the resistive element and the pad, and each of capacitive pads in each capacitive element includes a third thin film resistor, which is disposed between the capacitive element and the pad.

10. A semiconductor device comprising:

a first terminal and a second terminal, wherein the first terminal has a predetermined first potential smaller than a predetermined second potential of the second terminal;

n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element;

n resistive elements that are sequentially coupled in series between the first terminal and the second terminal, wherein one resistive element nearest the first terminal is defined as a first stage resistive element, and another resistive element nearest the second terminal is defined as a n-th stage resistive element; and n capacitive elements that are sequentially coupled in series between the first terminal and the second terminal, wherein one capacitive element nearest the first terminal is defined as a first stage capacitive element, and another capacitive element nearest the second terminal is defined as a n-th stage capacitive element, wherein each transistor element includes a source, gate and a drain, the gate of each transistor element has a gate pad, each transistor element includes a pair of transistor pads, which are disposed on both sides of the transistor element, the gate pad of the first stage transistor element provides an input terminal, one of the transistor pads of the n-th stage transistor element disposed on the second terminal side provides an output terminal, each resistive element includes a pair of resistive pads, which are disposed on both sides of the resistive element, each capacitive element includes a pair of capacitive pads, which are disposed on both sides of the capacitive element, the gate pad of each transistor element other than the first stage transistor element is connected to a first wiring layer, a corresponding one of the resistive pads between two adjacent resistive elements is connected to a second wiring layer, and a corresponding one of the capacitive pads between two adjacent capacitive elements is connected to a third wiring layer, the first to third wiring layers are stacked in this order through a first insulation film, and material of the first to third wiring layers is diffused into the first insulation film so that the first to third wiring layers are electrically coupled together, one of the transistor pads of the first stage transistor element disposed on the first terminal side is connected to a fourth wiring layer, one of the resistive pads of the first stage resistive element disposed on the first terminal side is connected to a fifth wiring layer, and one of the capacitive pads of the first stage capacitive element disposed on the first terminal side is connected to a sixth wiring layer, the fourth to sixth wiring layers are stacked in this order through a second insulation film, and material of the fourth to sixth wiring layers is diffused into the second insulation film so that the fourth to sixth wiring layers are electrically coupled together, one of the transistor pads of the n-th stage transistor element disposed on the second terminal side is connected to a seventh wiring layer, one of the resistive pads of the n-th stage resistive element disposed on the second terminal side is connected to an eight wiring layer, and one of the capacitive pads of the n-th stage capacitive element disposed on the second terminal side is connected to a ninth wiring layer, and the seventh to ninth wiring layers are stacked in this order through a third insulation film, and material of the seventh to ninth wiring layers is diffused into the third insulation film so that the seventh to ninth wiring layers are electrically coupled together.

11. The semiconductor device according to claim 10, wherein
each transistor element is disposed in a corresponding field region so that n field regions are electrically isolated together, and
each field region has an electric potential, which is stabilized with the gate of a corresponding transistor element.

12. The semiconductor device according to claim 10, wherein
the gate and transistor pads in each transistor element are disposed over a corresponding transistor element, the pair of resistive pads in each resistive element are disposed over a corresponding resistive element, or the pair of capacitive pads in each capacitive element are disposed over a corresponding capacitive element.

13. The semiconductor device according to claim 10, wherein
each of the gate and transistor pads in each transistor element includes a first thin film resistor, which is disposed between the transistor element and the pad,
each of resistive pads in each resistive element includes a second thin film resistor, which is disposed between the resistive element and the pad, and
each of capacitive pads in each capacitive element includes a third thin film resistor, which is disposed between the capacitive element and the pad.

14. A semiconductor device comprising:
a first terminal and a second terminal, wherein the first terminal has a predetermined first potential smaller than a predetermined second potential of the second terminal;
n transistor elements that are insulated and separated from each other and are sequentially coupled in series with each other between the first terminal and the second terminal, wherein n represents a predetermined natural number equal to or greater than two, and wherein one transistor element nearest the first terminal is defined as a first stage transistor element, and another transistor element nearest the second terminal is defined as a n-th stage transistor element;
n resistive elements that are sequentially coupled in series between the first terminal and the second terminal, wherein one resistive element nearest the first terminal is defined as a first stage resistive element, and another resistive element nearest the second terminal is defined as a n-th stage resistive element; and
n capacitive elements that are sequentially coupled in series between the first terminal and the second terminal, wherein one capacitive element nearest the first terminal is defined as a first stage capacitive element, and another capacitive element nearest the second terminal is defined as a n-th stage capacitive element, wherein
each transistor element includes a source, gate and a drain, the gate of each transistor element has a gate pad,
each transistor element includes a pair of transistor pads, which are disposed on both sides of the transistor element,
the gate pad of the first stage transistor element provides an input terminal,
one of the transistor pads of the n-th stage transistor element disposed on the second terminal side provides an output terminal,
each resistive element includes a pair of resistive pads, which are disposed on both sides of the resistive element, each capacitive element includes a pair of capacitive pads, which are disposed on both sides of the capacitive element,
the gate pad of each transistor element other than the first stage transistor element, a corresponding one of the resistive pads between two adjacent resistive elements, and a corresponding one of the capacitive pads between two adjacent capacitive elements are electrically connectable,
one of the transistor pads of the first stage transistor element disposed on the first terminal side, one of the resistive pads of the first stage resistive element disposed on the first terminal side, and one of the capacitive pads of the first stage capacitive element disposed on the first terminal side are electrically connectable, and
one of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side are electrically connectable.

15. The semiconductor device according to claim 14, wherein
each transistor element is disposed in a corresponding field region so that n field regions are electrically isolated together, and
each field region has an electric potential, which is stabilized with the gate of a corresponding transistor element.

16. The semiconductor device according to claim 14, wherein
the gate and transistor pads in each transistor element are disposed over a corresponding transistor element, the pair of resistive pads in each resistive element are disposed over a corresponding resistive element, or the pair of capacitive pads in each capacitive element are disposed over a corresponding capacitive element.

17. The semiconductor device according to claim 14, wherein
each of the gate and transistor pads in each transistor element includes a first thin film resistor, which is disposed between the transistor element and the pad,
each of resistive pads in each resistive element includes a second thin film resistor, which is disposed between the resistive element and the pad, and
each of capacitive pads in each capacitive element includes a third thin film resistor, which is disposed between the capacitive element and the pad.

18. A method for manufacturing a semiconductor device comprising:
sequentially coupling n transistor elements in series with each other between a first terminal and a second terminal, wherein the first terminal has a predetermined first potential smaller than a predetermined second potential of the second terminal, wherein n represents a predetermined natural number equal to or greater than two, wherein the n transistor elements are insulated and separated from each other, wherein one transistor element nearest the first terminal is defined as a first stage transistor element, and another transistor element nearest the second terminal is defined as a n-th stage transistor element, wherein each transistor element includes a source, gate and a drain, wherein the gate of each transistor element has a gate pad, wherein each transistor element includes a pair of transistor pads, which are disposed on both sides of the transistor element, wherein the gate pad of the first stage transistor element provides an input terminal, and wherein one of the transistor pads of the n-th stage transistor element disposed on the second terminal side provides an output terminal;

sequentially coupling n resistive elements in series between the first terminal and the second terminal, wherein one resistive element nearest the first terminal is defined as a first stage resistive element, and another resistive element nearest the second terminal is defined as a n-th stage resistive element, and wherein each resistive element includes a pair of resistive pads, which are disposed on both sides of the resistive element;

sequentially coupling n capacitive elements in series between the first terminal and the second terminal, wherein one capacitive element nearest the first terminal is defined as a first stage capacitive element, and another capacitive element nearest the second terminal is defined as a n-th stage capacitive element, and wherein each capacitive element includes a pair of capacitive pads, which are disposed on both sides of the capacitive element;

testing each transistor element with using corresponding gate and transistor pads;

testing each resistive element with using corresponding resistive pads;

testing each capacitive element with using corresponding capacitive pads;

electrically coupling the gate pad of each transistor element other than the first stage transistor element, a corresponding one of the resistive pads between two adjacent resistive elements, and a corresponding one of the capacitive pads between two adjacent capacitive elements;

electrically coupling one of the transistor pads of the first stage transistor element disposed on the first terminal side, one of the resistive pads of the first stage resistive element disposed on the first terminal side, and one of the capacitive pads of the first stage capacitive element disposed on the first terminal side; and electrically coupling one of the transistor pads of the n-th stage transistor element disposed on the second terminal side, one of the resistive pads of the n-th stage resistive element disposed on the second terminal side, and one of the capacitive pads of the n-th stage capacitive element disposed on the second terminal side.

19. The method according to claim 18, further comprising:

arranging each transistor element in a corresponding field region so that n field regions are electrically isolated together; and stabilizing an electric potential of each field region with the gate of a corresponding transistor element, wherein the testing each transistor element further includes detecting a leakage current between two field regions.

20. The method according to claim 18, wherein the gate pad of each transistor element other than the first stage transistor element, the corresponding one of the resistive pads between two adjacent resistive elements, and the corresponding one of the capacitive pads between two adjacent capacitive elements are electrically coupled together through a first conductive connection member, the one of the transistor pads of the first stage transistor element disposed on the first terminal side, the one of the resistive pads of the first stage resistive element disposed on the first terminal side, and the one of the capacitive pads of the first stage capacitive element disposed on the first terminal side are electrically coupled with a second conductive connection member, and the one of the transistor pads of the n-th stage transistor element disposed on the second terminal side, the one of the resistive pads of the n-th stage resistive element disposed on the second terminal side, and the one of the capacitive pads of the n-th stage capacitive element disposed on the second terminal side are electrically coupled with a third conductive connection member.

21. The method according to claim 18, wherein the gate pad of each transistor element other than the first stage transistor element, the corresponding one of the resistive pads between two adjacent resistive elements, and the corresponding one of the capacitive pads between two adjacent capacitive elements are electrically coupled together through a first switching element, the one of the transistor pads of the first stage transistor element disposed on the first terminal side, the one of the resistive pads of the first stage resistive element disposed on the first terminal side, and the one of the capacitive pads of the first stage capacitive element disposed on the first terminal side are electrically coupled with a second switching element, the one of the transistor pads of the n-th stage transistor element disposed on the second terminal side, the one of the resistive pads of the n-th stage resistive element disposed on the second terminal side, and the one of the capacitive pads of the n-th stage capacitive element disposed on the second terminal side are electrically coupled with a third switching element, in all of the testing each transistor element, the testing each resistive element and the testing each capacitive element, the first to third switching elements turn off, and in all of the electrically coupling the gate pad of each transistor element other than the first stage transistor element, the electrically coupling the one of the transistor pads of the first stage transistor element disposed on the first terminal side, and the electrically coupling the one of the transistor pads of the n-th stage transistor element disposed on the second terminal side, the first to third switching elements turn on.

22. The method according to claim 18, further comprising:

connecting the gate pad of each transistor element other than the first stage transistor element to a first wiring layer, connecting a corresponding one of the resistive pads between two adjacent resistive elements to a second wiring layer, and connecting a corresponding one of the capacitive pads between two adjacent capacitive elements to a third wiring layer;

stacking the first to third wiring layers in this order through a first insulation film;

connecting one of the transistor pads of the first stage transistor element disposed on the first terminal side to a fourth wiring layer, connecting one of the resistive pads of the first stage resistive element disposed on the first terminal side to a fifth wiring layer, and connecting one of the capacitive pads of the first stage capacitive element disposed on the first terminal side to a sixth wiring layer;

stacking the fourth to sixth wiring layers in this order through a second insulation film;

connecting one of the transistor pads of the n-th stage transistor element disposed on the second terminal side to a seventh wiring layer, connecting one of the resistive pads of the n-th stage resistive element disposed on the second terminal side to an eight wiring layer, and connecting one of the capacitive pads of the n-th stage capacitive element disposed on the second terminal side to a ninth wiring layer; and stacking the seventh to ninth wiring layers in this order through a third insulation film, wherein the electrically coupling the gate pad of each transistor element other than the first stage transistor element includes diffusing material of the first to third wiring layers into the first insulation film so that the first to third wiring layers are electrically coupled together, the electrically coupling one of the transistor pads of the first stage transistor element disposed on the first terminal side includes diffusing material of the fourth to sixth wiring layers into the second insulation film so that the fourth to sixth wiring layers are electrically coupled together, and the electrically coupling one of the transistor pads of the n-th stage transistor element disposed on the second terminal side includes diffusing material of the seventh to ninth wiring layers into the third insulation film so that the seventh to ninth wiring layers are electrically coupled together.

23. A semiconductor device comprising:

a plurality of transistors that are insulated and separated from each other and are coupled in series between a ground potential and a constant voltage terminal;

a plurality of pairs of a voltage dividing resistor and a diode, wherein the voltage dividing resistor and the diode in each pair are coupled in series between two gates of corresponding adjacent transistors;

a plurality of capacitors, each of which is coupled in parallel with a corresponding pair of the voltage dividing resistor and the diode between two gates of corresponding adjacent transistors; and a plurality of test pads, each of which is coupled with a gate of a corresponding transistor, wherein each diode is coupled in series with a corresponding voltage dividing resistor so that current flows through the voltage dividing resistor when a corresponding transistor turns on, a current path is provided between two adjacent test pads through a corresponding pair of the voltage dividing resistor and the diode when a predetermined voltage is applied between the two adjacent test pads so as to apply a forward bias to the diode, and a current path is provided between two adjacent test pads through a corresponding capacitor when a predetermined voltage is applied between the two adjacent test pads so as to apply a reverse bias to the diode.

24. A method for manufacturing a semiconductor device comprising:

coupling a plurality of transistors in series between a ground potential and a constant voltage terminal, wherein the transistors are insulated and separated from each other;

coupling a pair of a voltage dividing resistor and a diode in series between two gates of corresponding adjacent transistors, wherein each diode is coupled in series with a corresponding voltage dividing resistor so that current flows through the voltage dividing resistor when a corresponding transistor turns on;

coupling a capacitor in parallel with a corresponding pair of the voltage dividing resistor and the diode between two gates of corresponding adjacent transistors;

coupling a test pad with a gate of a corresponding transistor;

detecting a resistance of one of the voltage dividing resistors, wherein the detecting includes applying a predetermined voltage between corresponding two adjacent test pads so as to apply a forward bias to a corresponding diode so that a current path is formed between the corresponding two adjacent test pads through the one of the voltage dividing resistors and the corresponding diode; and detecting a current leakage resistance of one of the capacitors, wherein the detecting includes applying a predetermined voltage between corresponding two adjacent test pads so as to apply a reverse bias to a corresponding diode so that a current path is formed between the corresponding two adjacent test pads through the one of the capacitors.

* * * * *